(12) United States Patent
Kito et al.

(10) Patent No.: US 6,650,672 B2
(45) Date of Patent: Nov. 18, 2003

(54) SEMICONDUCTOR LASER ELEMENT HAVING EXCELLENT LIGHT CONFINEMENT EFFECT AND METHOD FOR PRODUCING THE SEMICONDUCTOR LASER ELEMENT

(75) Inventors: Masahiro Kito, Suita (JP); Masato Ishino, Shijounawate (JP)

(73) Assignee: Matsushita Electric Industrial Co., Ltd., Osaka-fu (JP)

(*) Notice: Subject to any disclaimer, the term of this patent is extended or adjusted under 35 U.S.C. 154(b) by 13 days.

(21) Appl. No.: 09/805,511

(22) Filed: Mar. 13, 2001

(65) Prior Publication Data

US 2002/0126721 A1 Sep. 12, 2002

(30) Foreign Application Priority Data

Mar. 13, 2000 (JP) ........................... 2000-069121

(51) Int. Cl.[7] .............. H01S 5/00; H01S 3/08
(52) U.S. Cl. ................ 372/45; 372/50; 372/96
(58) Field of Search ................ 372/96, 45, 50

(56) References Cited

U.S. PATENT DOCUMENTS

| 5,325,392 A | * | 6/1994 | Tohmori et al. | 372/96 |
| 5,617,445 A | * | 4/1997 | Jewell | 372/96 |
| 5,727,013 A | | 3/1998 | Botez et al. | |
| 6,134,043 A | * | 10/2000 | Johms et al. | 359/237 |

FOREIGN PATENT DOCUMENTS

JP  9-64458  *  3/1997

* cited by examiner

Primary Examiner—Eddie Lee
Assistant Examiner—Joseph Nguyen

(57) ABSTRACT

A semiconductor laser element including: a three-dimensional photonic crystal structure which has a light confining effect and includes alternating first and second refractive index changing layers, where refractive index of light periodically changes in a first direction in each first refractive index changing layer and periodically changes in a second direction in each second refractive index changing layer; and an active unit which is disposed in a portion having a predetermined refractive index inside the three-dimensional photonic crystal structure, and generates a laser beam in response to reception of electric power.

28 Claims, 14 Drawing Sheets

FIG.9
FIG.9A
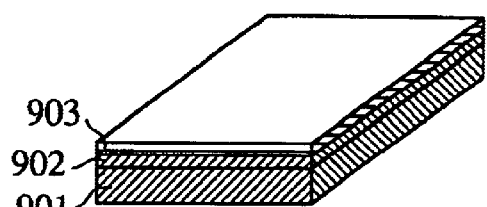
FIG.9B
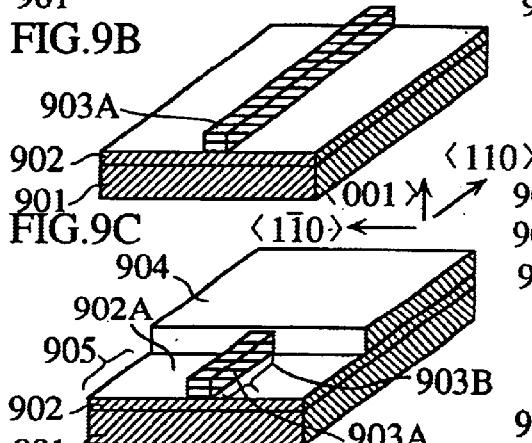
FIG.9C
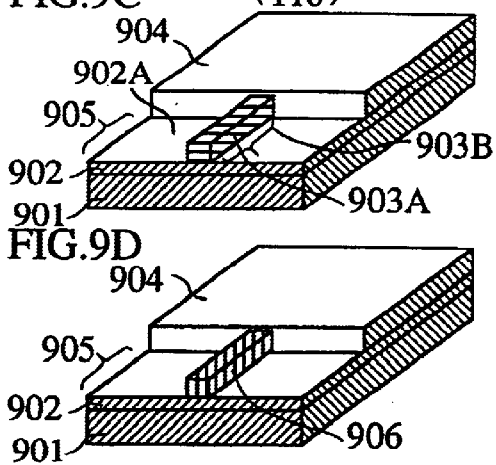
FIG.9D
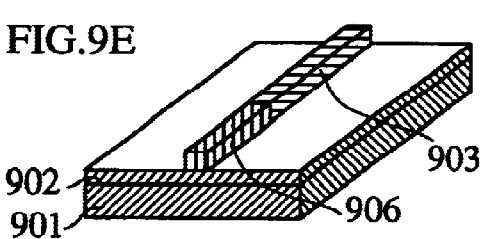
FIG.9E
FIG.9F
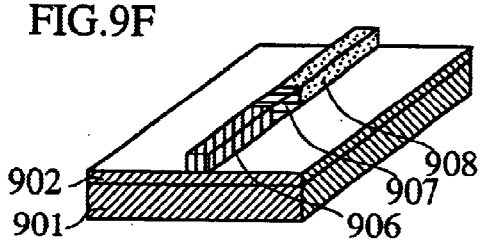
FIG.9G
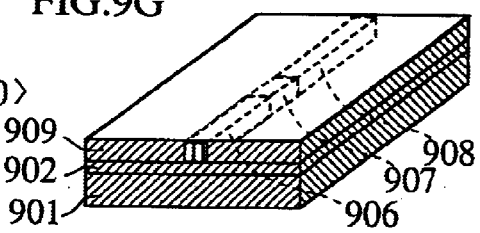
FIG.9H
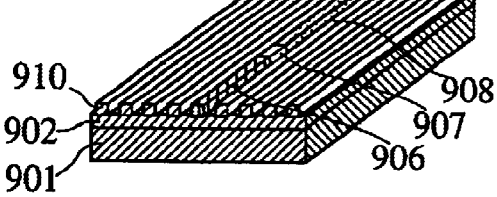
FIG.9I
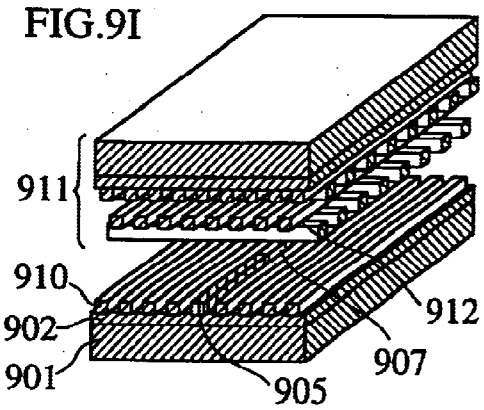

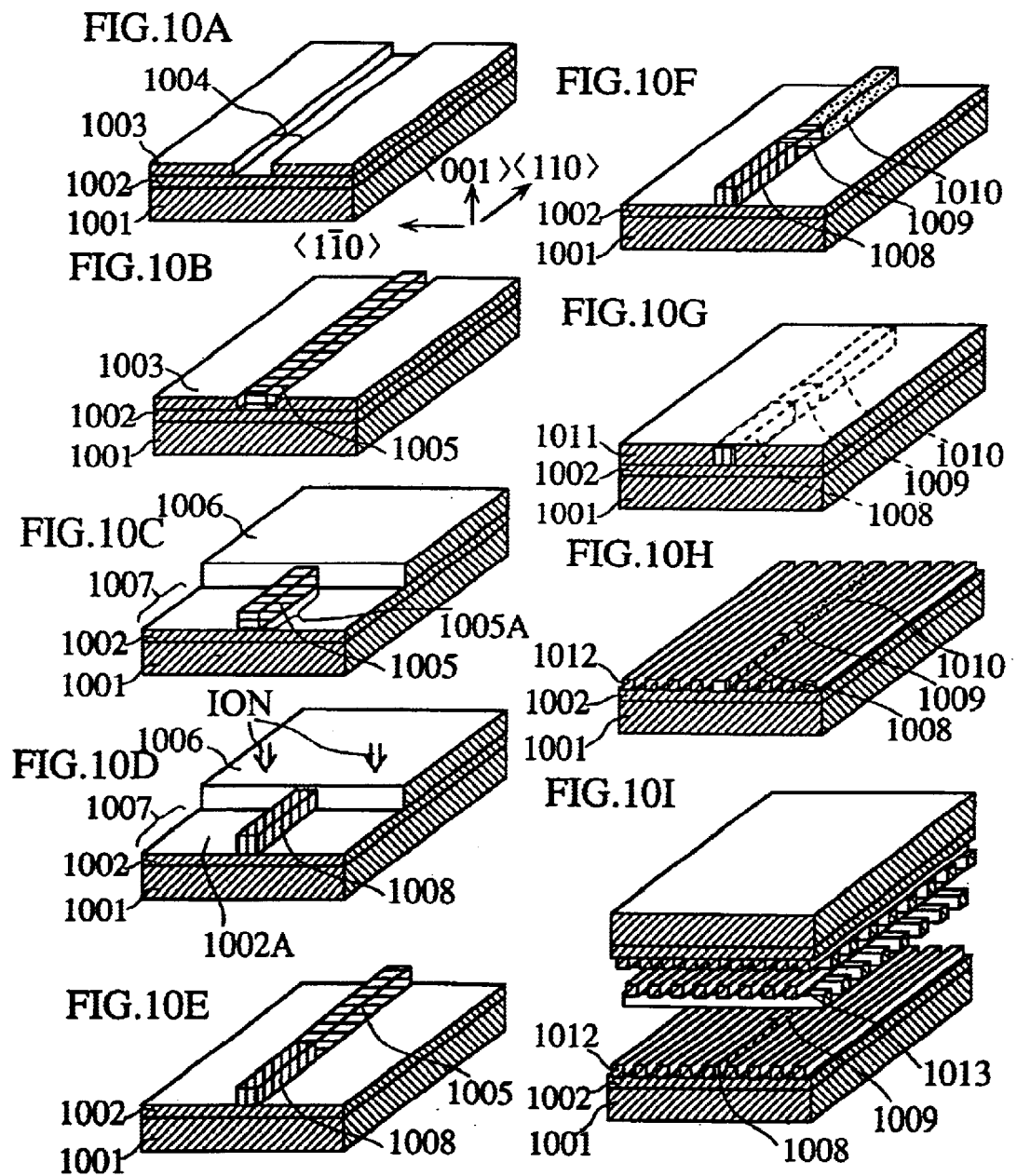

SEMICONDUCTOR LASER ELEMENT HAVING EXCELLENT LIGHT CONFINEMENT EFFECT AND METHOD FOR PRODUCING THE SEMICONDUCTOR LASER ELEMENT

BACKGROUND OF THE INVENTION (1) Field of the Invention

The present invention relates to a semiconductor laser element and a method for producing the semiconductor laser element. More particularly, the present invention relates to a semiconductor laser element suitable for a light source of an optical communication and a light source of an optical disc, and relates to a method for producing the semiconductor laser element.

(2) Description of Related Art

Typically, conventional semiconductor laser element is composed of a p-type electrode, an n-type electrode, a p-type light waveguide, an n-type light waveguide, and an active layer.

The p-type electrode, n-type electrode, p-type light waveguide, n-type light waveguide are disposed in the vicinity of the active layer, and are made of different materials from the active layer. With such a construction, light generated in the active layer is confined in the semiconductor laser element, a reduced emission is generated in the active layer, and laser light is generated. There is also known a semiconductor laser element that amplifies light with a certain wavelength, using Fabry-Perot resonator in which a cleavage plane is used as a resonator.

It is desired however that the conventional semiconductor laser elements have a low-threshold-current characteristic to be under improved control when they are used as light sources for light communications or optical discs.

SUMMARY OF THE INVENTION

It is therefore an object of the present invention to provide a semiconductor laser element having an excellent light confinement effect and a low-threshold-current characteristic, and a method for producing the semiconductor laser element.

Recently, an artificially created dielectric constant three-dimensional periodic structure has received attention. This structure controls the movement of electromagnetic waves so as to move like electrons in crystals. This artificially created structure is called three-dimensional photonic crystal. The electromagnetic band that is caused by this structure and is equivalent to a band of light is called a photonic band.

The reason why the photonic band structure is receiving attention is that the structure may create a laser light whose output or wavelength does not change much with the change of temperature since it has a very low threshold value (theoretically it has no threshold value) and can perfectly control photons in space, which has been impossible for conventional techniques. Also, the photonic band structure is superior in electricity-light energy exchange efficiency since it controls emitted light in all directions in space. In other words, the photonic band structure may provide a low-power-consumption laser. It is thought that especially, a three-dimensional photonic band structure having the dielectric constant three-dimensional periodic structure provides the above effect at the maximum.

FIG. 14 shows an example of the three-dimensional photonic crystal structure (disclosed in the Japanese Laid-Open Patent Application No. 10-335758).

The three-dimensional photonic crystal structure shown in FIG. 14 is made by periodically stacking layers of two or more kinds of materials which each periodically have pits and projections. For example, Si and SiO2 are used as the materials for the layers 1401 and 1402, and are referred to as A1401 and B1402, respectively. With such a three-dimensional structure, the propagation of light having a certain wavelength is cut and confined in the crystal structure due to the difference between the refractive indexes of light of the materials A1401 and B1402. However, it is substantially impossible to achieve a semiconductor laser element by forming an active layer inside the above three-dimensional photonic crystal structure. Also, even if the active layer is formed inside the structure, it is difficult to form a waveguide for obtaining light.

In consideration of the above problems, the inventors of the present invention conceived a semiconductor laser element that uses the excellent light confinement effect of the three-dimensional photonic crystal structure by forming inside the three-dimensional photonic crystal structure an active unit that generates laser beams after receiving power, the three-dimensional photonic crystal structure being made of a stack of a plurality of refractive index changing layers in which a refractive index of light periodically changes in a certain direction.

The above object is fulfilled by a semiconductor laser element comprising: a three-dimensional photonic crystal structure which has a light confining effect and includes alternating first and second refractive index changing layers, wherein refractive index of light periodically changes in a first direction in each first refractive index changing layer and periodically changes in a second direction in each second refractive index changing layer; and an active unit which is disposed in a portion having a predetermined refractive index inside the three-dimensional photonic crystal structure, and generates a laser beam in response to reception of electric power.

With the above construction, it is possible to achieve a semiconductor laser element that has an excellent effect of confining the light generated in the active layer and a low-threshold-current characteristic since it uses the light confinement effect of the three-dimensional photonic crystal structure. Also, the three-dimensional photonic crystal structure of the present invention uses, instead of the conventional honeycomb-layer stack structure, first refractive index changing layers and second refractive index changing layers which are alternately stacked, where the refractive index of light periodically changes in a first direction in the first refractive index changing layers, and changes in a second direction in the second refractive index changing layers. This enables the active layer to be formed during the layer stacking process, achieving a semiconductor laser element using the three-dimensional photonic crystal structure.

In the above semiconductor laser element, the active unit may be disposed substantially at a center of the three-dimensional photonic crystal structure.

With the above construction, the active unit is disposed at the center of the three-dimensional photonic crystal structure. This enhances the light confinement effect and decreases the threshold of the electric current.

The above semiconductor laser element may further comprise a light waveguide which extends horizontally from an end of the active unit to at least a vicinity of an end of the three-dimensional photonic crystal structure.

In the above semiconductor laser element, each first refractive index changing layer may be composed of a plurality of optically refractive stripes arranged parallel to each other with a predetermined pitch so that refractive index of light periodically changes in the first direction, each second refractive index changing layer is composed of a plurality of optically refractive stripes arranged parallel to each other with substantially the same pitch as the predetermined pitch so that refractive index of light periodically changes in the second direction, phase of period of the plurality of optically refractive stripes constituting one refractive index changing layer is different from a phase of period of the plurality of optically refractive stripes constituting adjacent refractive index changing layer, and a laser emitting stripe that includes the active unit is disposed in place of one optically refractive stripe.

In the above semiconductor laser element, the active unit may be disposed substantially at a center of the laser emitting stripe in the direction of length, and two portions ranging from both ends of the active unit to both ends of the laser emitting stripe are a p-type light waveguide and an n-type light waveguide, respectively, the p-type and n-type light waveguides each doubling as a carrier conduction path.

The above semiconductor laser element may further comprise: a p-type carrier conduction path formed to overlap the p-type light waveguide; an n-type carrier conduction path formed to overlap the n-type light waveguide; a p-type contact layer formed to overlap the p-type light waveguide; a p-type electrode formed to overlap the p-type light waveguide; an n-type contact layer formed to overlap the n-type light waveguide; and an n-type electrode formed to overlap the n-type light waveguide.

The above semiconductor laser element may further comprise a high-reflection layer covering a side of the laser emitting stripe at an end in the direction of length.

In the above semiconductor laser element, the high-reflection layer may be composed of a plurality or dielectric layers.

In the above semiconductor laser element, the high-reflection layer may include at least a $SiO_2$ layer and an amorphous Si layer, in the order from an end of the laser emitting stripe.

In the above semiconductor laser element, each optically refractive stripe may be made of a material selected from the group consisting of InP, GaAs, AlGaInP, MgZnSSe, and AlGaN.

In the above semiconductor laser element, each first refractive index changing layer may be composed of (a) a plurality of optically refractive stripes arranged parallel to each other with a predetermined pitch and (b) a plurality of dielectric stripes displacing space between the plurality of optically refractive stripe so that refractive index of light periodically changes in the first direction, each second refractive index changing layer is composed of (c) a plurality of optically refractive stripes arranged parallel to each other with substantially the same pitch as the predetermined pitch and (d) a plurality of dielectric stripes displacing space between the plurality of optically refractive stripes in (c) so that refractive index of light periodically changes in the second direction, phase of period of the plurality of optically refractive stripes constituting one refractive index changing layer is different from phase of period of the plurality of optically refractive stripes constituting adjacent refractive index changing layer, and one optically refractive stripe has been replaced with a laser emitting stripe that includes the active unit.

With the above construction, the semiconductor laser element is prevented from being oxidized by air. This improves the reliability of the element.

The above object is also fulfilled by a method of producing the above semiconductor laser element, characterized by an assembling step for systematically arranging and assembling a plurality of optically refractive stripes and a laser emitting stripe including an active unit that generates a laser beam in response to reception of electric power.

With the above construction, it impossible to form the active unit during the process for stacking each component constituting the three-dimensional photonic crystal structure, achieving a semiconductor laser element using the three-dimensional photonic crystal structure. This achieves a semiconductor laser element that has an excellent effect of confining the light generated in the active layer and a low-threshold-current characteristic since it uses the light confinement effect of the three-dimensional photonic crystal structure.

In the above semiconductor laser element production method, the assembling step may include: a first large step for forming a refractive index changing layer by arranging optically refractive stripes in parallel to each other so that refractive index of light periodically changes in a predetermined direction; a second large step for forming a laser emitting layer in which refractive index of light periodically changes in a predetermined direction, by arranging the laser emitting stripe and optically refractive stripes in parallel to each other; and a third large step for stacking the refractive index changing layer and the laser emitting layer.

With the above construction, it is possible to form the active unit during the process for stacking each component constituting the three-dimensional photonic crystal structure, and also possible to achieve a semiconductor laser element using the three-dimensional photonic crystal structure without difficulty since it uses, instead of the conventional honeycomb-layer stack structure, first refractive index changing layers and second refractive index changing layers which are alternately stacked, where the refractive index of light periodically changes in a first direction in the first refractive index changing layers, and changes in a second direction in the second refractive index changing layers.

In the above semiconductor laser element production method, in the first large step, the refractive index changing layer may be formed by arranging optically refractive stripes in parallel to each other with a predetermined pitch so that refractive index of light periodically changes, the optically refractive stripes having a different refractive index of light from air layers between the optically refractive stripes, and in the second large step, the laser emitting layer is formed by arranging optically refractive stripes in parallel to each other with the same pitch as the refractive index changing layer, disposing the laser emitting stripe at a center of the optically refractive stripes instead of an optically refractive stripe.

In the above semiconductor laser element production method, the second large step may include: a first step for forming an etching stop layer on a surface of a substrate; a second step for forming on a surface of the etching stop layer an active unit area whose shape is similar to that of the active unit; a third step for forming on the surface of the etching stop layer a p-type light waveguide area and an n-type light waveguide area in the vicinity of the active unit area, shapes of the p-type light waveguide area and the n-type light waveguide area being similar to those of a p-type light waveguide and an n-type light waveguide, respectively; a fourth step for forming on the surface of the etching stop layer an optically refractive material layer to enclose the active unit area, the p-type light waveguide area, and the n-type light waveguide area; and a fifth step for forming the laser emitting layer by shaping the optically refractive material layer into a plurality of stripes with the same period as each refractive index changing layer, using a patterning method, wherein the third large step includes a removing step for removing the etching stop layer and the substrate after the retractive index changing layer and the laser emitting layer are stacked.

In the above semiconductor laser element production method, the second step may include: a first small step for forming on the surface of the etching stop layer a layer of a material of the active unit; and a second small step for forming the active unit area by partially removing the layer using a patterning method.

In the above semiconductor laser element production method, the second step may include: a first small step for forming on the surface of the etching stop layer a layer of an insulating material; a second small step for forming a pit in the insulating material layer; a third small step for forming the active unit area in the pit by an organometallic vapor deposition method; and a fourth small step for removing the insulating material layer after the active unit area is formed.

In the above semiconductor laser element production method, the active unit may be a quantum well type, and the second step may include: a first small step for forming an etching stop layer on a surface of a substrate; a second small step for forming on a surface of the etching stop layer a stripe of a material of the active unit having a size enough to include the active unit, a p-type light waveguide, and an n-type light waveguide; a third small step for introducing impurities into the active unit material stripe except for a center portion thereof so that two impurities-introduced portions around the center portion become a p-type light waveguide area and an n-type light waveguide area, and so that the center portion becomes an active unit area; a fourth small step for forming on the surface of the etching stop layer an optically refractive material layer to enclose the active unit area, the p-type light waveguide area, and the n-type light waveguide area; and a fifth step for forming the laser emitting layer by shaping the optically refractive material layer into a plurality of stripes with the same period as the refractive index changing layer, using a patterning method, wherein the third large step includes a removing step for removing the etching stop layer after the refractive index changing layer and the laser emitting layer are stacked.

In the above semiconductor laser element production method, the second step may include: a first small step for forming on the surface of the etching stop layer a layer of a material of the active unit; and a second small step for forming the active unit material stripe by partially removing the layer using a patterning method.

In the above semiconductor laser element production method, the second step may include; a first small step for forming on the surface of the etching stop layer a layer of an insulating material; a second small step for forming a channel in the insulating material layer; a third small step for forming the active unit area in the channel by an organometallic vapor deposition method; and a fourth small step for removing the insulating material layer after the active unit area is formed.

The above semiconductor laser element production method may further comprise a conduction path forming step for forming the p-type carrier conduction path and the n-type carrier conduction path to overlap the p-type light waveguide and the n-type light waveguide, respectively, after a three-dimensional photonic crystal structure is formed by stacking the refractive index changing layer and the laser emitting layer.

In the above semiconductor laser element production method, the assembling step may include: a first large step for forming a refractive index changing layer by arranging (a) a plurality of optically refractive stripes in parallel to each other and (b) a plurality of dielectric stripes displacing space between the plurality of optically refractive stripes so that refractive index of light periodically changes in a predetermined direction; a second large step for forming a laser emitting layer in which refractive index of light periodically changes in a predetermined direction, by arranging the laser emitting stripe and optically refractive stripes in parallel to each other and arranging a plurality of dielectric stripes to displace space between the laser emitting stripe and the optically refractive stripes so that refractive index of light periodically changes in a predetermined direction; and a third large step for stacking the refractive index changing layer and the laser emitting layer.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings:

FIGS. 9A to 9I show a procedure of producing the laser emitting layer including the light confining unit in Embodiment 3, proceeding in the order presented;

FIGS. 10A to 10I show a procedure of producing the laser emitting layer including the light confining unit in Embodiment 4, proceeding in the order presented;

DESCRIPTION OF THE PREFERRED EMBODIMENTS

Figure 1A:
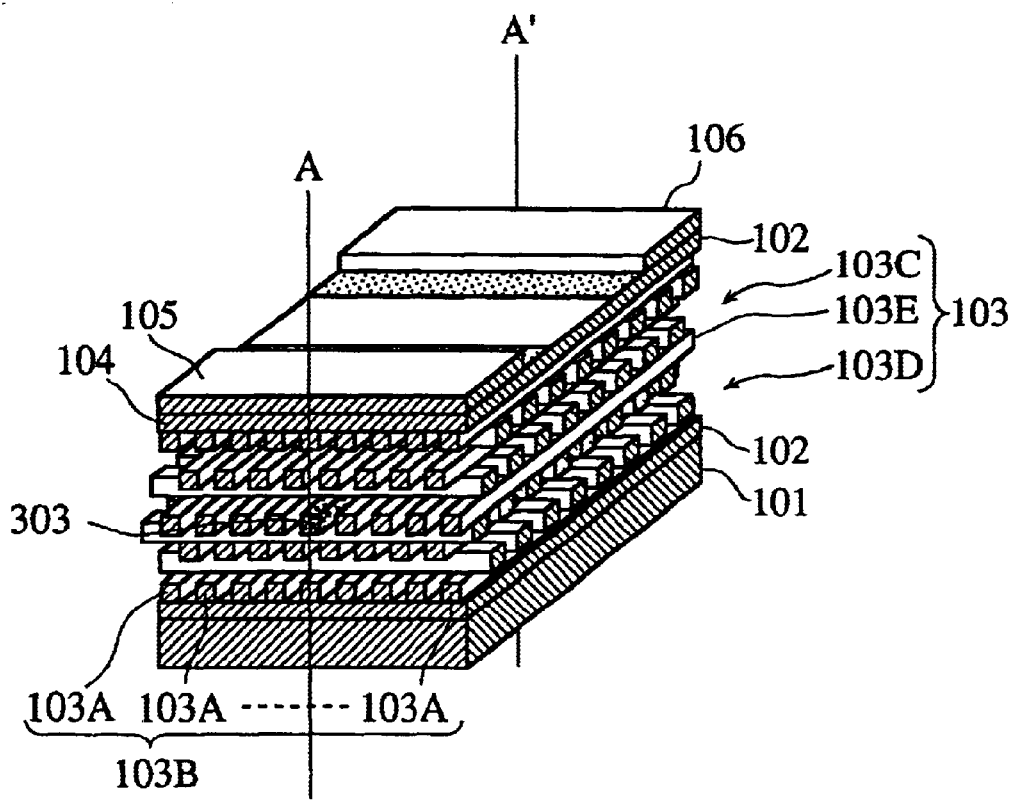
FIG. 1A is a perspective view of a semiconductor laser element in Embodiment 1 of the present invention.

The following are description of the present invention through specific embodiments thereof by way of referring to the drawings.

Embodiment 1

The semiconductor laser element in Embodiment 1 of the present invention will be described with reference to the drawings.

Figure 1B:
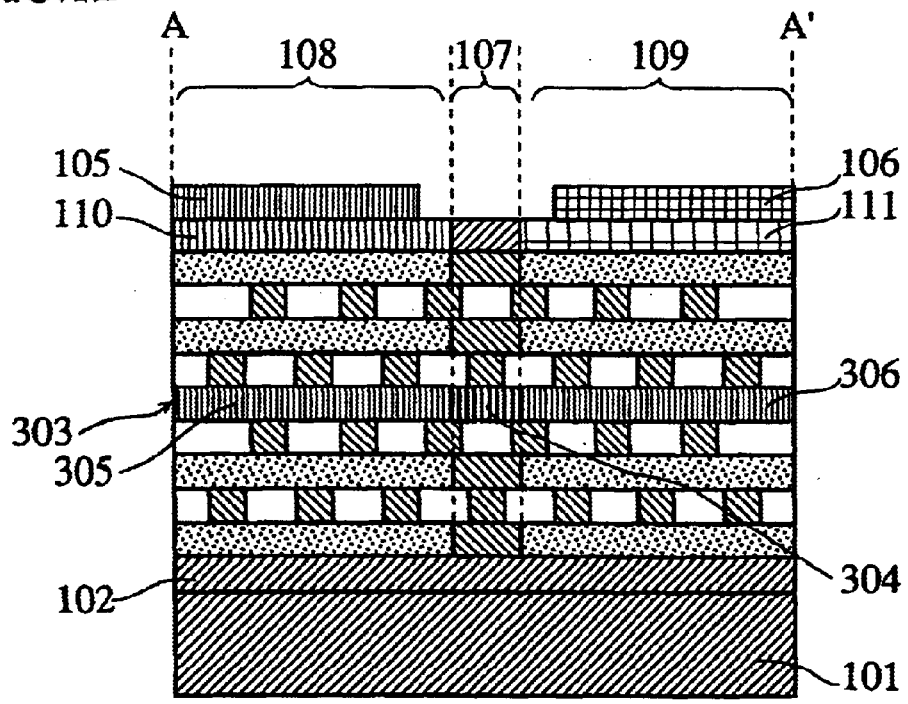
FIG. 1B is a sectional view taken substantially along line A–A' of FIG. 1A.

FIG. 1A is a perspective view of a semiconductor laser element 1 in the present embodiment. FIG. 1B is a sectional view taken substantially along line A–A' of FIG. 1A.

The semiconductor laser element 1 uses the light confinement effect of the three-dimensional photonic crystal structure, and, as shown in FIGS. 1A and 1D, includes, from bottom to top, a high-resistence InP substrate 101, an undope InGaAs etching stop layer 102, a three-dimensional photonic crystal structure 103, an InGaAs contact layer 104 which is 0.2 µm in thickness and is composed of a p-type portion, an n-type portion, and an insulating portion, a p-type electrode 105, and an n-type electrode 106.

The three-dimensional photonic Crystal structure 103 is composed of an upper structure 103C, a lower structure 103D, and a laser emitting layer 103E which is sandwiched by the upper structure 103C and the lower structure 103D. The upper structure 103C and the lower structure 103D are each a stack of refractive index changing layers 103B which are each composed of a plurality of InP stripes 103A arranged parallel to each other with a certain pitch so that the refractive index of light periodically changes in a certain direction.

The laser emitting layer 103E is formed by replacing an InP stripe in the center of a refractive index changing layer 103B with a light confining unit 303 that includes an active layer.

Now, positions of the refractive index changing layers 103B and the laser emitting layer 103E will be described.

Figure 2A:
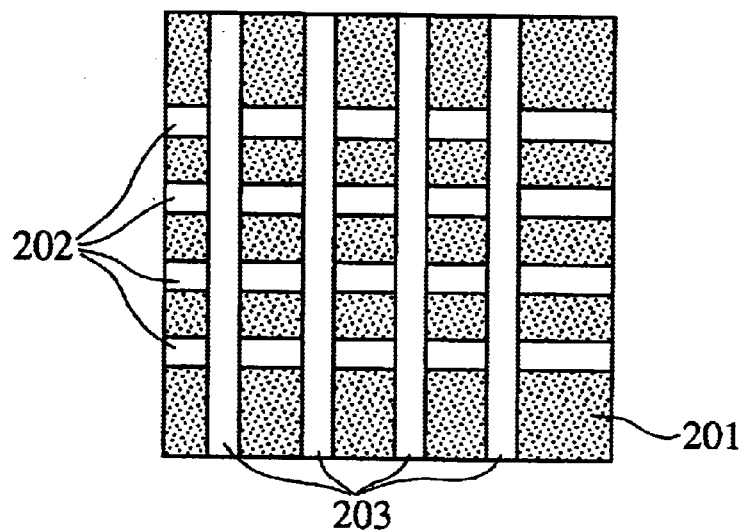
FIGS. 2A to 2C are top plan views of the three-dimensional photonic crystal structure showing its construction and positional relationships between the InP stripes.
Figure 2B:
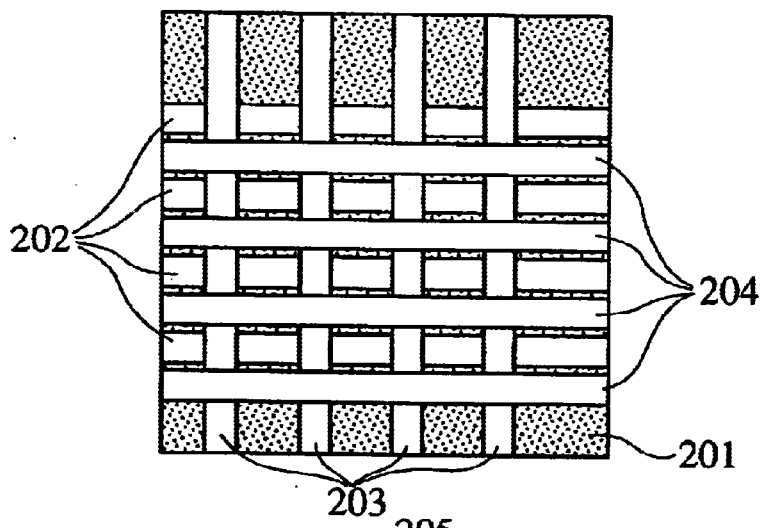
Figure 2C:
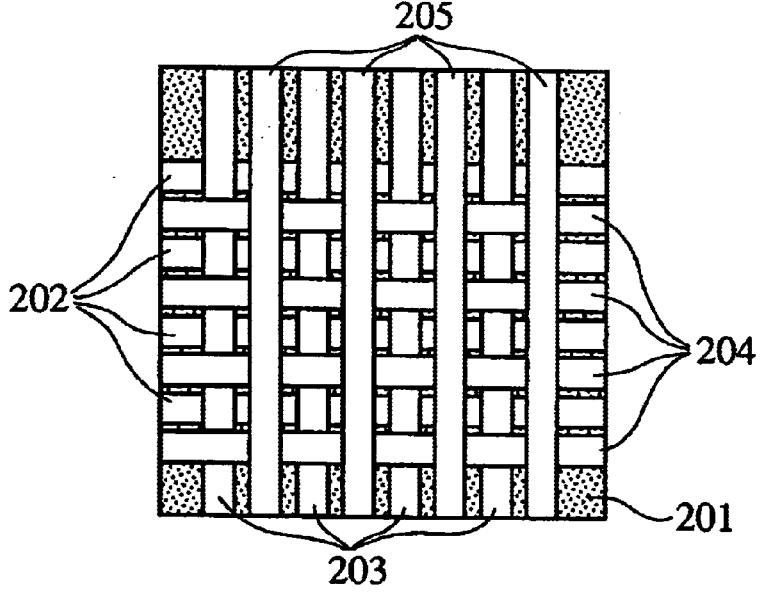

FIGS. 2A to 2C are top plan views of the three-dimensional photonic crystal structure 103.

As shown in FIG. 2A, a plurality of InP stripes 202 are stacked on a substrate 201, which is a stack of the high-resistence InP substrate 101 and the undope InGaAs etching Stop layer 102, and then a plurality of InP stripes 203 are stacked on the plurality of InP stripes 202 so that they are perpendicular to each other. As shown in FIG. 2B, a plurality of InP stripes 204 stacked on the stripes 203 are parallel to the plurality of InP stripes 202, but the phase of period is different from each other by 180° (reversed). As shown in FIG. 2C, a plurality of InP stripes 205 are stacked on the stripes 204 to be perpendicular to each other. The plurality of InP stripes 205 are parallel to the plurality of InP stripes 203, but the phase of period is different from each other. InP stripes are further stacked on the stripes 205 in a similar manner as described above, repeating the relationships between the first layer (InP stripes 202) to the fourth layer (InP stripes 205).

The above construction forms a face centered cubic structure in which air layers and InP layers having different refractive indexes of light are systematically and three-dimensionally arranged, achieving a three-dimensional photonic crystal structure (S. Noda et al., Jpn. J. Appl. Phys., 35, L909 (1996)). It should be noted here that the wavelength of light to be confined is determined by the period in the arrangement of the air layers (or the InP layers).

The period (pitch) in arranging the stripes (InP stripes or the air layers) for the three-dimensional photonic crystal structure is obtained using the following formula.

Formula 1

Period (pitch): wavelength×0.4
Stripe width: wavelength×0.1
Layer thickness: wavelength×0.12

Figure 3:
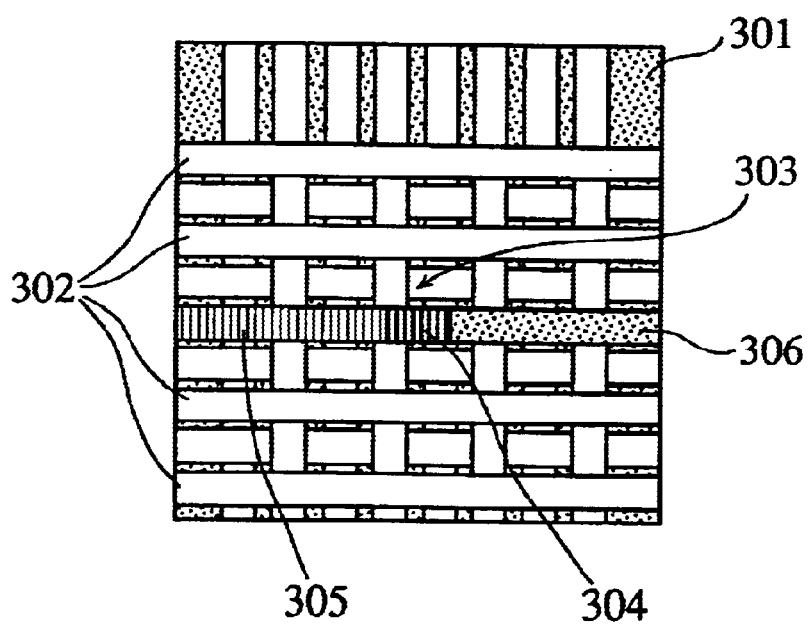
FIG. 3 is a top perspective view of the semiconductor laser element, showing the construction of the light confining unit.

FIG. 3 is a top perspective view of the three-dimensional photonic crystal structure.

As shown in FIG. 3, the light confining unit 303 in the laser emitting layer 103E is composed of: an active layer 304 located at the center part of the light confining unit 303 in the direction of the length; a p-type light waveguide 305 that is adjacent to one side of the active layer 304; and an n-type light waveguide 306 that is adjacent to the other side of the active layer 304.

When power is supplied from the p-type light waveguide 305 and the n-type light waveguide 306 to the active layer 304, light is generated in the active layer 304. The light (in the present embodiment, an infrared ray with light wavelength range of 1.3 µm) is amplified by the three-dimensional photonic crystal surrounding the active layer covering every direction, where the three-dimensional photonic crystal functions as what is called a resonator. As a result of the amplification, substantially all rays of the light localize in the active layer 304. This achieves the semiconductor laser having a low-threshold-current characteristic.

Meanwhile, the p-type light waveguide 305 and the n-type light waveguide 306 are made of a different material from InP which is the material of the surrounding layers. Since the refractive index of the material is greatly different from that of InP, the light may exist in the p-type light waveguide 305 and the n-type light waveguide 306. As understood from this, each of the p-type light waveguide 305 and the n-type light waveguide 306 functions as a carrier conduction path and a light waveguide.

The three-dimensional photonic crystal structure 103 is composed of three areas. The first area is a high-resistance area 107 that includes the active layer 304, where the high-resistance area 107 is an insulating area, excluding the active layer. The second area is a p-type conduction area (hole conduction area) 108 including the p-type light waveguide 305. The third area is an n-type conduction area 109 including the n-type light waveguide 306 (electron conduction area) (see FIG. 1B).

The p-type electrode supplies holes to the p-type conduction area 108 via a p-type InGaAs contact layer 110. The n-type electrode 106 supplies electrons to the n-type conduction area 109 via an n-type InGaAs contact layer 111. With this construction, when compared to the case where electric current directly flows into the p-type light waveguide 305 and the n-type light waveguide 306, the wider the area of contact between InP stripes is, the wider the area in which electric current flows is. This reduces resistance.

Now, a method for producing the above semiconductor laser element will be described with reference to the drawings.

The semiconductor laser element is produced by first forming the three-dimensional photonic crystal structure that includes the light confining unit at the center part thereof, then forming the InGaAs contact layer 104, p-type electrode 105, and n-type electrode 106 on the three-dimensional photonic crystal structure.

FIGS. 4A to 4F show a procedure in a method for producing the three-dimensional photonic crystal structure.

Figure 4A:
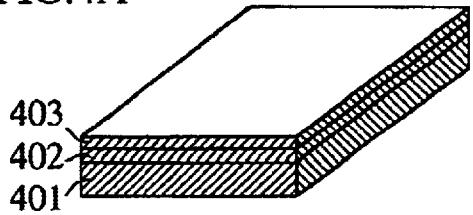
FIGS. 4A to 4F show a procedure in a method for producing the three-dimensional photonic crystal structure, proceeding in the order presented.

As shown in FIG. 4A, an undope InGaAs etching stop layer 402 having a certain thickness (e.g., 0.15 μm) is formed on a high-resistence InP substrate 401 which has a (001) crystal face orientation, by the organometallic vapor deposition method. An undope InGaAs layer 403 having a certain thickness.(e.g., 0.16 μm) is then formed on the undope InGaAs etching stop layer 402 also by the organometallic vapor deposition method.

Figure 4B:
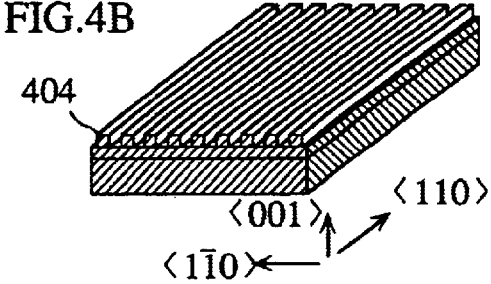

As shown in FIG. 4B, the undope InGaAs layer 403 is shaped, by the etching method, into an InP stripe layer 404 which is composed of a plurality of InP stripes arranged in parallel with a certain period, extending in the direction of a (110) crystal face orientation, each stripe having a certain width (e g., 0.13 μm). It should be noted here that a period is a distance between centers of two adjacent stripes. In this example, the period is 0.52 μm. The InP stripe layer 404 completed in this way is equivalent to the refractive index changing layer 103B. The wavelength range of the light confined in the three-dimensional photonic crystal structure is determined according to the period and size of the InP stripes. The above specific values for the period or the like correspond to the case where a laser light oscillation wavelength range of 1.3 μm is used.

Figure 4C:
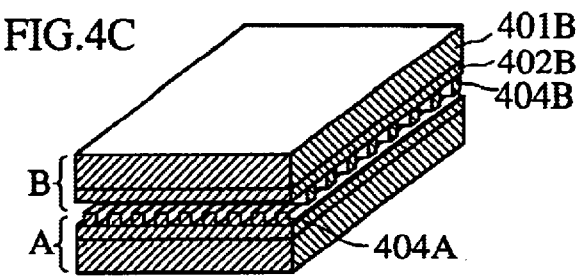

Two structures which each include the layers 401, 402, and 404 as shown in FIG. 4B are prepared. The two structures A and B are put together so that the XnP stripes of the InP stripe layers 404 of the two structures face each other and are perpendicular to each other (90° C.). The two structures A and B are then heated while the InP stripe layers 404 (404A and 404B) of the two structures are in contact so that the layers 404A and 404B are bonded in the level of atoms. This results in two refractive index changing layers being bonded together, as shown in FIG. 4C. Note that the heating process is performed in the presence oxygen. This applies to the other bonding processes that will be described later.

Figure 4D:
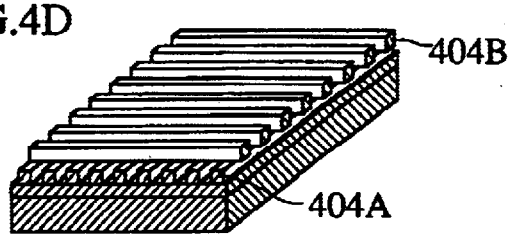

An InP substrate of either of the structures A and B (in this example, the structure B) is then removed by the etching method. The undope InGaAs etching stop layer 402 of the same structure is then removed by the etching method. FIG. 4D shows the result.

Figure 4E:
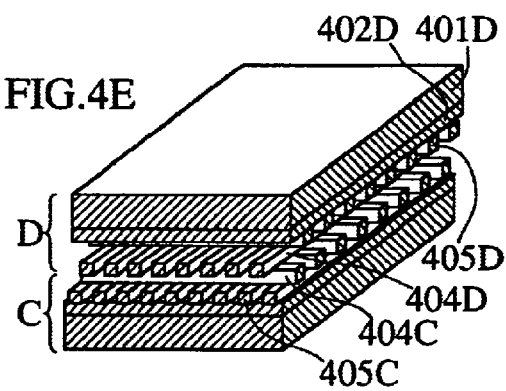

Two structures which are each obtained through the processes shown in FIGS. 4A to 4D are prepared as structures C and D. The two structures C and D are put together so that the InP stripes of the InP stripe layers 404 (404C and 404D) at the top of the structures face each other and are perpendicular to each other (90° C.). Here, the InP stripes of the InP stripe layer 404D and an InP stripe layer 405C (which are arranged with one InP stripe layer in between) are parallel to each other, but the phase of period is different from each other by 180°. The two structures C and D are then heated while the InP stripe layer 404D and the InP stripe layer 405C are in contact, so that the InP stripe layers 404D and 405C are bonded in the level of atoms. This results in three refractive index changing layers being bonded together, as shown in FIG. 4E.

Figure 4F:
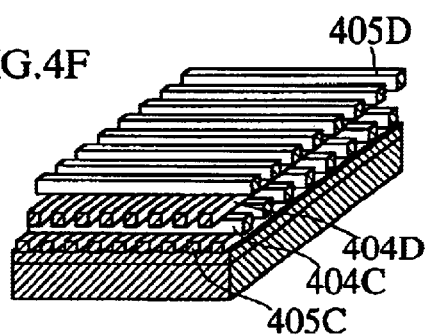

An InP substrate and an undope InGaAs etching stop layer of either of the structures C and D are then removed by the etching method. FIG. 4F shows the result.

With the above process, the upper structure and the lower structure used for the three-dimensional photonic crystal structure are completed.

Now, a method for producing the laser emitting layer which includes the light confining unit 303 composed of the active layer, the p-type light waveguide, and the n-type light waveguide will be described with reference to the drawings.

FIGS. 5A to 5I show a procedure of producing the laser emitting layer. FIGS. 6A to 6C show a procedure of completing the three-dimensional photonic crystal structure after producing the active layer, and are a continuation of FIG. 4F.

Figure 5A:
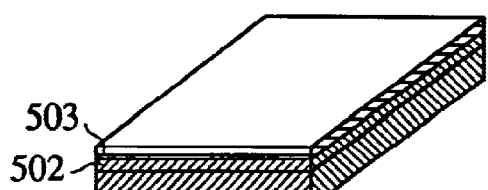
FIGS. 5A to 5I show a procedure of producing the laser emitting layer that includes the light confining unit, proceeding in the order presented.
Figure 6A:
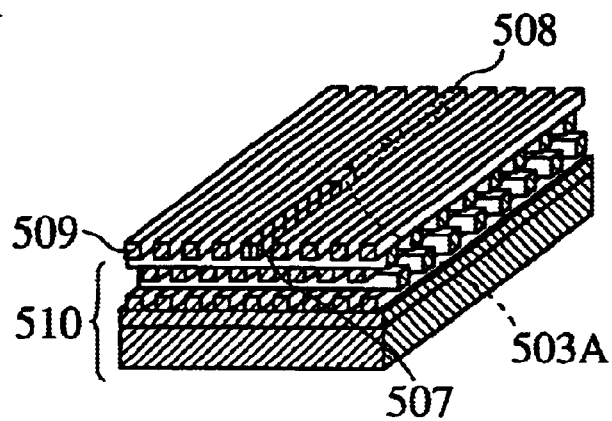
FIGS. 6A to 6C show a procedure of completing the three-dimensional photonic crystal structure by bonding the structures produced in the processes shown in FIGS. 4A to 5I, proceeding in the order presented.
Figure 6B:
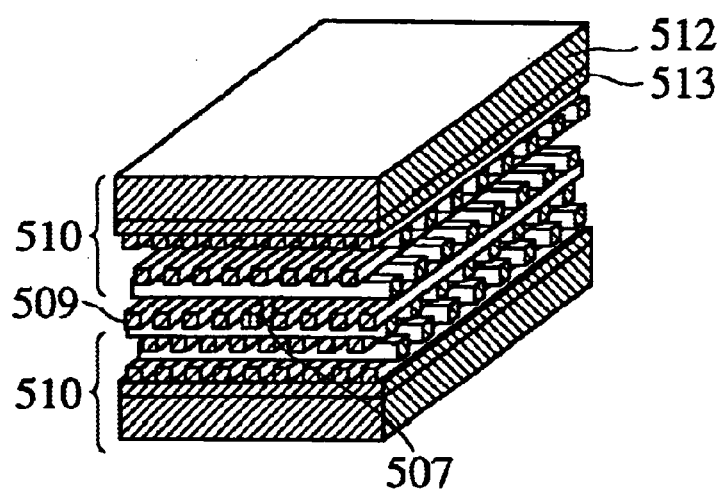
Figure 6C:
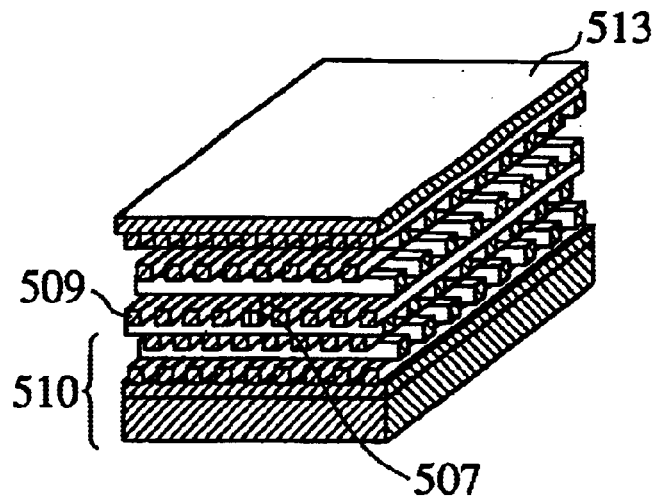

As shown in FIG. 5A, an undope InGaAs etching stop layer 502 having a certain thickness (e.g., 0.15 μm) is formed on a high-resistence InP substrate 501 which has a (001) crystal face orientation, by the organometallic vapor deposition method. An InGaAsP layer 503 having a certain thickness (e.g., 0.18 μm) and a certain composition wavelength range (e.g., 1.3 μm) is then formed on the undope InGaAs etching stop layer 502 also by the organometallic vapor deposition method.

Figure 5B:
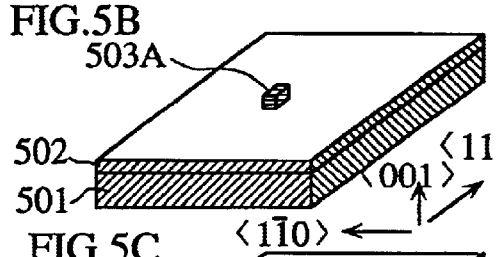

As shown in FIG. 5B, the InGaAsP layer 503 is partially removed by the etching method to leave an InGaAsP layer 503A which has a certain width or length (e.g., 0.1 μm) in the direction of a (110) crystal race orientation and a certain width or length (e.g., 0.3 μm) in the direction of a (1-10) crystal face orientation. The InGaAsP layer 503A is expected to become the active layer 304 later. It should be noted here that according to a notation for representing a crystal face orientation, a stripe may be attached above a numeral. In the present document, however, a minus sign is inserted before such a numeral to represent the same direction as the above notation.

Figure 5C:
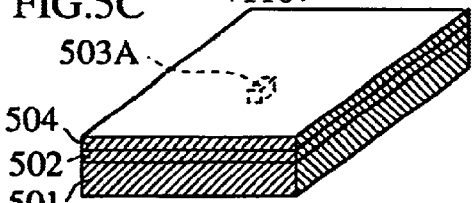

As shown in FIG. 5C, an undope InP layer 504 having a certain thickness (e.g., 0.19 μm) is then formed on the undope InGaAs etching stop layer 502 by the organometallic vapor deposition method, enclosing the InGaAsP layer 503A having been formed on the surface of the layer 502.

Figure 5D:
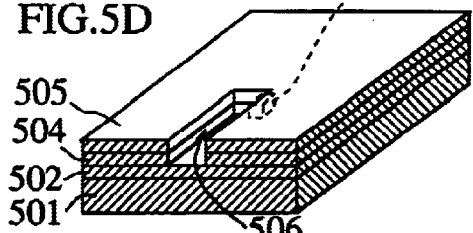

A SiO$_2$ layer 505 is then formed on the undope InP layer 504. The SiO$_2$ layer 505 is partially removed by the etching method. The undope InP layer 504 is then partially removed by the etching method, using the raining SiO$_2$ layer 505 as a mask. As a result of this, a structure shown in FIG. 5D is obtained. The structure has a channel 506 that is formed by partially cutting the undope InP layer 504 and SiO$_2$ layer 505. The channel 506 is 500 μm long in the direction of a (110) crystal face orientation and is 0.4 μm wide in the direction of a (1-10) crystal face orientation, for example. Also, the channel 506 is formed so that a side of the InGaAsP layer 503A is exposed to inside the channel 506. This is because the activation layer should contact the p-type light waveguide which is to be formed later.

Figure 5E:
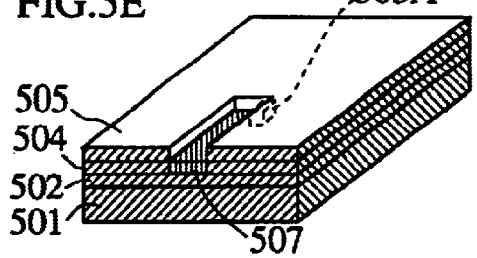

As shown in FIG. 5E, an InGaAsP layer 507 is formed in the channel 506 by allowing InGaAsP with a certain composition wavelength range (e.g., 1.05 μm) to deposit to be as high as the undope InP layer 504. The InGaAsP layer 507 is expected to become the p-type light waveguide 305 later.

Figure 5F:
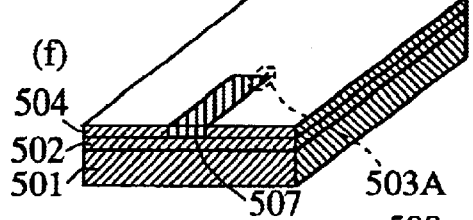

As show in FIG. 5F, the SiO$_2$ layer 505 is removed by the etching method.

Figure 5G:
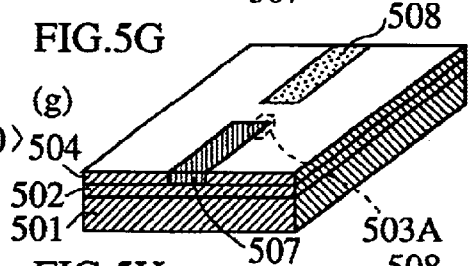

As show in FIG. 5G, an InGaAsP layer 508 is formed in the same way as shown in FIGS. 5D to 5F so that the InGaAsP layer 503A is sandwiched by the InGaAsP layers 507 and 508 in the direction of a (110) crystal face orientation. In this example, InGaAsP layer 508 has the same composition wavelength range as the InGaAsP layer 507. The InGaAsP layer 508 is expected to become the n-type light waveguide 306 later.

Figure 5H:
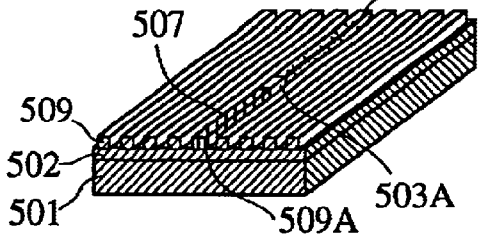

As show in FIG. 5H, the undope InP layer 504, InGaAsP area 503A, InGaAsP layer 507, and InGaAsP layer 508 are shaped by the etching method into a plurality of stripes so that the InGaAsP area 503A, InGaAsP layer 507, and InGaAsP layer 508 are included in one stripe. In this way, a plurality of stripes 509 extending in the direction of a (110) crystal face orientation are manufactured. The stripes 509 have the same period and width as the plurality of InP stripes which are used for the three-dimensional photonic crystal structure. Here, one stripe 509A in which the InGaAsP area 503A, InGaAsP layer 507, and InGaAsP layer 508 are included is used at the light confining unit 303.

In this way, the laser emitting layer is completed.

Figure 5I:
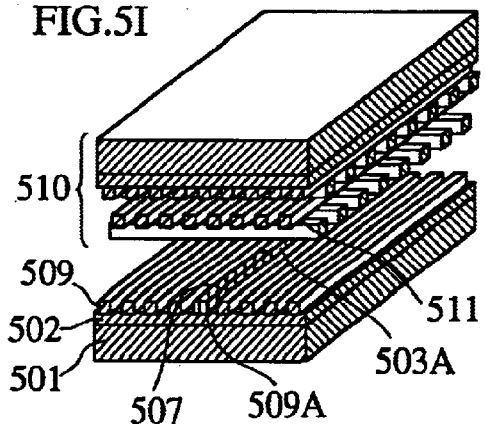

As shown in FIG. 5I, a structure 510 which has been manufactured earlier and shown in FIG. 4F and the structure shown in FIG. 5H are put together so that the stripes of the two structures face each other and are perpendicular to each other (90° C.). The two structures are then heated while the stripes of the two structures are in contact so that the layers are bonded. Here, the stripes 509 and stripes 511 which are separated from the stripes 509 by one layer are parallel to each other, but the phase of period is different from each other by 180°.

The high-resistence InP substrate 501 and undope InGaAs etching stop layer 502 on the side of the stripes 509 are then removed by the etching method. FIG. 6A shows the result.

The structure 510 and a structure shown in FIG. 6A are put together so that the stripes of the two structures face each other and are perpendicular to each other (90° C.). The two structures are then heated while the stripes of the two structures are in contact so that the layers are bonded. Here, the two layers sandwiching the stripes 509 are parallel to each other, but the phase of period is different from each other by 180°. FIG. 6B shows the result.

With the above process, the three-dimensional photonic crystal structure is completed. The three-dimensional photonic crystal structure includes the laser emitting layer including the light confining unit 303, sandwiched by the upper and lower structures, where the active layer is located at the center part of the light confining unit 303 in the direction of the length.

As shown in FIG. 6C, the InP substrate 512 (same as 401 in FIG. 4) is removed from one side of the above structure by the etching method to expose an undope InGaAs etching stop layer 513 (same as 402 in FIG. 4).

Figure 7A:
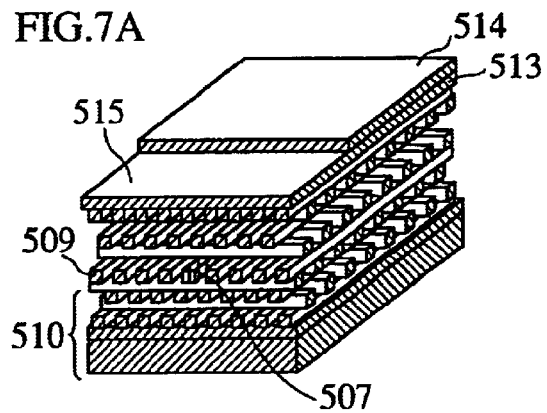
FIGS. 7A to 7D show a final stage in completing the semiconductor laser element, proceeding in the order presented.

An SiO$_2$ layer 514 is then formed on the surface of the undope InGaAs etching stop layer 513, and as shown in FIG. 7A, is removed partially by the etching method. The etching is performed so that the whole InGaAsP area 503A and the whole InGaAsP area 508 reside under the SiO$_2$ layer 514 and so that at least a part of the InGaAsP layer 507 resides under the exposed portion 515 of the undope InGaAs etching stop layer 513. This is because impurities should be injected from a selected position as follows.

Figure 7B:
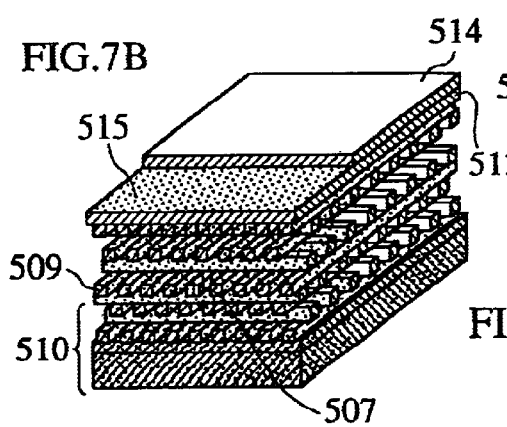

As shown in FIG. 7B, impurity ions (in this example, Zn) are injected through the exposed portion 515 of the undope InGaAs etching stop layer 513. The resultant structure is then subjected to a heat treatment to activate the impurity ions so that the impurity ions are introduced into a portion (corresponding to element 110 in FIG. 1. In the next process, corresponding to element 111 in FIG. 1) of the undope InGaAs etching stop layer 513 and into the InP stripes ranging from the InGaAs layer to the InGaAsP layer 507 of the three-dimensional photonic crystal structure. After introduction of impurity ions, the impurity-ion-introduced portions become p-type.

Figure 7C:
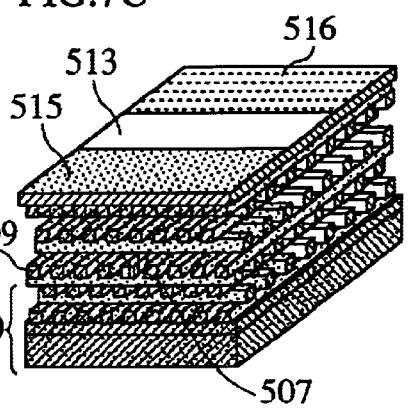

As shown in FIG. 7C, impurity ions (in this example, Si) are injected through exposed portion 516 of the undope InGaAs etching stop layer 513 so that the impurity ions are introduced into the undope InGaAs etching stop layer 513 and into the InP stripes ranging to the n-type light waveguide of the three-dimensional photonic crystal structure. After introduction of the impurity ions, the impurity-ion-introduced portions become n-type.

Figure 7D:
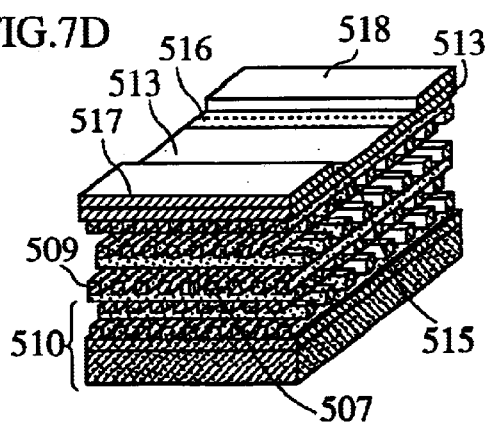

Lastly, as shown in FIG. 7D, a p-type electrode 517 is formed on the surface of the p-type portion of the InGaAs layer, and an n-type electrode 518 is formed on the surface of the n-type portion of the InGaAs layer. This completes the semiconductor laser element.

Embodiment 2

The semiconductor laser element in Embodiment 2 of the present invention will be described. The semiconductor laser element in Embodiment 2 is the same as Embodiment 1 in terms of the construction, but different in terms of the production method.

Now, the method of producing the semiconductor laser element will be described with reference to FIGS. 4 and 6–8.

FIGS. 8A to 8I show a procedure of producing the laser emitting layer including the light confining unit.

Figure 8A:
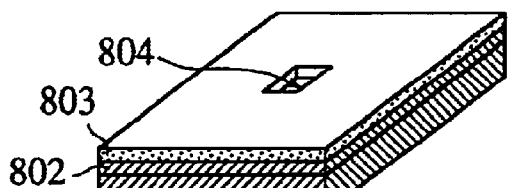
FIGS. 8A to 8I show a procedure of producing the laser emitting layer including the light confining unit in Embodiment 2, proceeding in the order presented.

An undope InGaAs etching stop layer 802 having a certain thickness (e.g., 0.15 μm) is formed on a high-resistence InP substrate 801 which has a (001) crystal face orientation, by the organometallic vapor deposition method. A SiO$_2$ layer 803 is then formed on the undope InGaAs etching stop layer 802. A pit 804 is formed by removing a part of the SiO$_2$ layer 803, which is made of an insulating material, so that a corresponding surface of the undope InGaAs etching stop layer 802 is exposed. FIG. 8A shows the result.

The pit 804 is, for example, 0.15 μm wide in the direction of a (110) crystal face orientation, and 0.35 μm long in the direction of a (1-10) crystal face orientation.

Figure 8B:
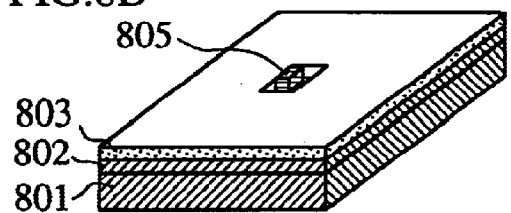

As shown in FIG. 8B, an InGaAsP area 805 having a certain composition wavelength range (in this example, 1.3 μm) is formed at a predetermined position in the pit 804 by the organometallic vapor deposition method. It should be noted here that when the organometallic vapor deposition method is used to grow a layer of InGaAsP, crystals only grow on the surface of the undope InGaAs etching stop layer 802, not on the surface of the SiO$_2$ layer. This makes it possible to grow the InGaAsP area 805 at a predetermined position in the pit 804. Other insulating materials than SiO$_2$, such as SiN, may be used.

Figure 8C:
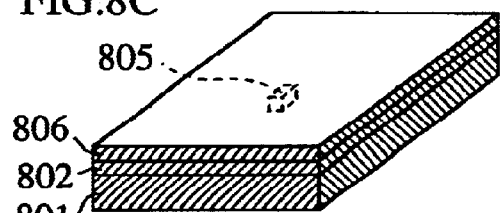

As shown in FIG. 8C, the remaining SiO$_2$ layer 803 is removed by the etching method. An undope InP layer 806 is formed to enclose the InGaAsP area 805.

A SiO$_2$ layer 807 is formed on the undope InP layer 806. A channel 807A is formed by partially removing the SiO$_2$ layer 807 by the etching method. A channel 806A having the same pattern as the channel 807A is formed by partially removing the undope InP layer 806 by the etching method using the remaining SiO$_2$ layer 807 as a mask. It should be noted here that the channel 806A is formed so that a side of the InGaAsP area 805 is exposed to inside the channel 806A.

Figure 8D:
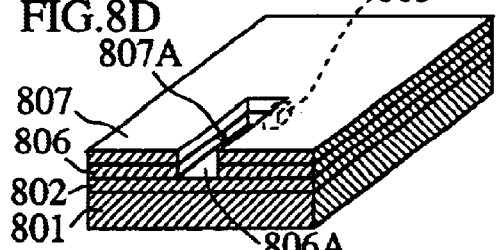
Figure 8E:
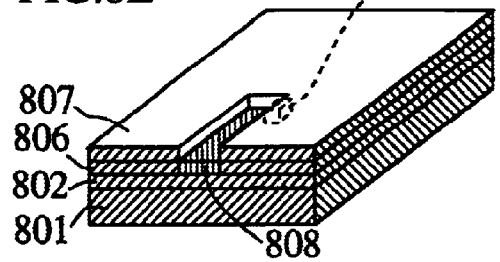

As shown in FIG. 8E, an InGaAsP layer 808 having a certain composition wavelength range (e.g., 1.05 μm) is formed in the channel 806A by the organometallic vapor deposition method.

Figure 8F:
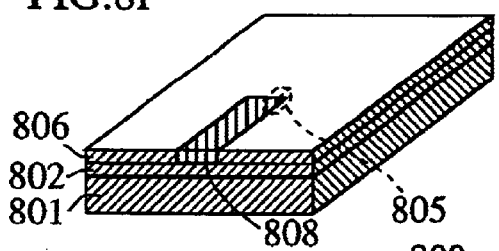

As shown in FIG. 8F, the SiO$_2$ layer 807 is removed.

Figure 8G:
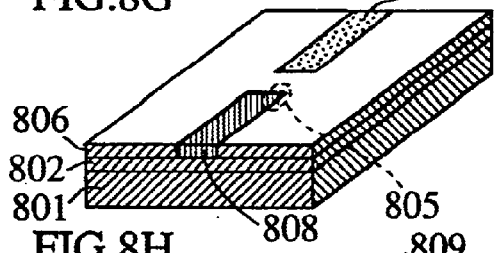

As show in FIG. 8G, an InGaAsP layer 809 is formed in the same way as shown in FIGS. 8D to 8F so that the InFaAsP layer 805 is sandwiched by the InGaAsP layers 808 and 809 in the direction of a (110) crystal face orientation. In this example, InGaAsP layer 808 has the same composition wavelength range as the InGaAsP layer 809.

Figure 8H:
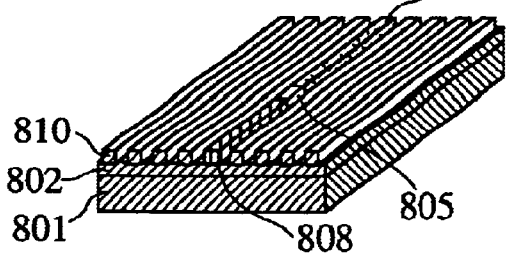

As show in FIG. 8H, the undope InP layer 806, InGaAsP area 805, InGaAsP layer 808, and InGaAsP layer 809 are shaped by the etching method into a plurality of stripes so that the InGaAsP area 805, InGaAsP layer 808, and InGaAsP layer 809 are included in one stripe. In this way, a plurality of stripes 810 extending in the direction of a (110) crystal face orientation are manufactured. The stripes 810 have the same period and width as the plurality of InP stripes which are used for the three-dimensional photonic crystal structure. Here, one stripe in which the InGaAsP area OSA, InGaAsP layer 808, and InGaAsP layer 809 are included is used as the light confining unit.

In this way, the laser emitting layer is completed.

Figure 8I:
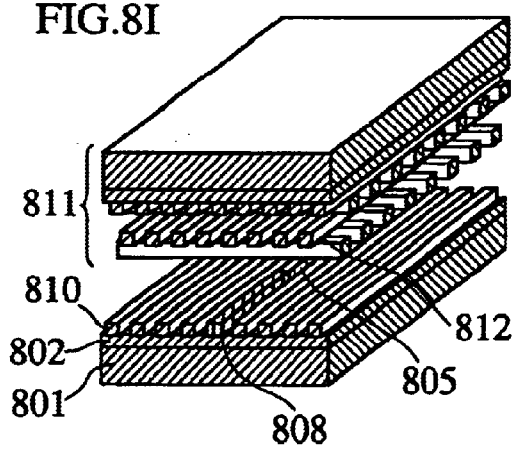

As shown in FIG. 8I, a structure 811 which has been manufactured earlier and shown in FIG. 4F and the structure shown in FIG. 8H are put together so that the stripes of the two structures face each other and are perpendicular to each other (90° C.). The two structures are then heated while the stripes of the two structures are in contact so that the layers are bonded. Here, the stripes 810 and stripes 812 which are separated from the stripes 810 by one layer are parallel to each other, but the phase of period is different from each other by 180°.

The high-resistence InP substrate 501 and undope InGeAs etching stop layer 502 on the side of the stripes 509 are then removed by the etching method. FIG. 6A shows the result.

The semiconductor laser element in the present embodiment is completed after being subjected to the processes shown in FIGS. 6A to 7D.

According to the production method in the present embodiment, the etching process for forming the active layer is not required, which is different from Embodiment 1. This prevents the active layer from generating a defect and enables a highly reliable semiconductor laser element to be achieved.

Embodiment 3

The semiconductor laser element in Embodiment 3 of the present invention will be described. The construction of the semiconductor laser element in Embodiment 3 is the same as Embodiment 1 except that the active layer has a multiple quantum well structure.

The active layer 304 in the present embodiment is composed of a plurality of (e.g., five) pairs of a well layer and a barrier rib layer. The well layer may be made of InGaAsP having composition wavelength range of 1.4 μm. Also, the barrier rib layer may be made of InGaAsP having composition wavelength range of 1.05 μm. The well layer may be 0.006 μm thick, and the barrier rib layer may be 0.01 μm thick.

Now, the method of producing the semiconductor laser element in the present embodiment will be described with reference to the drawings.

FIGS. 9A to 9I show a procedure of producing the laser emitting layer including the light confining unit.

As shown in FIG. 9A, an undope InGaAs etching stop layer 902 having a certain thickness is first formed on a high-resistance InP substrate 901 which has a (001) crystal face orientation, by the organometallic vapor deposition method. A multiple quantum well layer 903 composed of the well layers and barrier rib layers is then formed on the undope InGaAs etching stop layer 902 by the organometallic vapor deposition method. The multiple quantum well layer 903 is composed of a plurality of (e.g., five) pairs of a well layer and a barrier rib layer. The well layer may be made of InGaAsP having composition wavelength range of 1.4 μm. Also, the barrier rib layer may be made of InGaAsP having composition wavelength range of 1.05 μm. The well layer may be 0.006 μm thick, and the barrier rib layer may be 0.01 μm thick.

A multiple quantum well stripe 903A extending in the direction of a (110) crystal face orientation is then formed by partially removing the multiple quantum well layer 903 by the etching method. The multiple quantum well stripe 903A is, for example, 500 μm long in the direction of a (110) crystal face orientation and 0.3 μm wide in the direction of a (1-10) crystal face orientation.

An SiO$_2$ layer 904 is formed on the surface of the undope InGaAs etching stop layer 902 to enclose a certain portion of the multiple quantum well stripe 903A including one end thereof, as shown in FIG. 9C.

As shown in FIG. 9D, impurity ions (in this example, Zn) are injected through (1) a portion 903B or the multiple quantum well stripe 903A that is not covered with the SiO$_2$ layer 904 and (2) a surface 905 of a portion 902A of the undope InGaAs etching stop layer 902. The resultant structure is then subjected to a heat treatment so that the impurity-ion-introduced portions become p-type. The impurity-ion-introduced portions 903B and 902A are disordered in terms of the quantum well structure, and then function as light waveguides since the band gap energy exceeds the lasing energy.

The SiO$_2$ layer 904 is then removed as shown in FIG. 9E.

An SiO$_2$ layer is again formed on the surface of the undope InGaAs etching stop layer 902 to enclose only a part of the portion of the multiple quantum well stripe 903A that was not covered with the SiO$_2$ layer 904; impurity ions (in this example, Si) are injected through exposed portions; and the resultant structure is subjected to a heat treatment so that the impurity-ion-introduced portions become n-type, in the same manner as shown in FIGS. 9C to 9E. The Si-introduced portions of the active layer are disordered in terms of the quantum well structure, and then function as light waveguides since the band gap energy exceeds the lasing energy.

After the above process, the multiple quantum well stripe 903A is composed of a p-type light waveguide 906, a multiple quantum well area 907, and an n-type light waveguide 906 arranged in series in the extending direction of the stripes.

As shown in FIG. 9G, an undope InP layer 909 is formed on the surface of the undope InGaAs etching stop layer 902 (including a doped portion) to enclose the p-type light waveguide 906, multiple quantum well area 907, and n-type light waveguide 908.

As show in FIG. 9H, an undope InP layer 909, the p-type light waveguide 906, multiple quantum well area 907, and n-type light waveguide 908 are shaped by the etching method into a plurality of stripes so that the p-type light waveguide 906, multiple quantum well area 907, and n-type light waveguide 908 are included in one stripe. In this way, a plurality of stripes 910 extending in the direction of a (110) crystal face orientation are manufactured. The stripes 910 have the same period and width as the plurality of InP stripes which are used for the three-dimensional photonic crystal structure. Here, one stripe in which the p-type light waveguide 906, multiple quantum well area 907, and n-type Light waveguide 908 are included is used as the light confining unit.

In this way, the laser emitting layer is completed.

As shown in FIG. 9I, a structure 911 which has been manufactured earlier and shown in FIG. 4F and the structure shown in FIG. 9H are put together so that the stripes of the two structures face each other and are perpendicular to each other (90° C.). The two structures are then heated while the stripes of the two structures are in contact so that the layers are bonded. Here, the stripes 910 and stripes 912 which are separated from the stripes 910 by one layer are parallel to each other, but the phase of period is different from each other by 180°.

The semiconductor laser element in the present embodiment is completed after being subjected to the processes shown in FIGS. 6A to 7D.

According to the production method in the present embodiment, a process for re-growing crystals for forming the light waveguides is eliminated. That is to say, it is not necessary to grow a layer specifically to form a light waveguide since with this method, first a multiple quantum well stripe is formed at a location which is expected to become a light waveguide, and then the multiple quantum well stripe is disordered.

Embodiment 4

The semiconductor laser element in Embodiment 4 of the present invention will be described. The semiconductor laser element in Embodiment 4 is the same as Embodiment 1 in terms of the construction, but different in terms of the method of producing the light confining unit. The following describes only the differences.

FIGS. 10A to 10I show a procedure of producing the laser emitting layer including the light confining unit.

An undope InGaAs etching stop layer 1002 having a certain thickness (e.g., 0.15 $\mu$m) is formed on a high-resistance InP substrate 1001 which has a (001) crystal face orientation, by the organometallic vapor deposition method. A SiO$_2$ layer 1003, an insulating layer, is then formed on the undope InGaAs etching stop layer 1002 by the organometallic vapor deposition method. A channel 1004 is then formed by removing a part of the SiO$_2$ layer 1003 so that a corresponding surface of the undope InGaAs etching stop layer 1002 is exposed. FIG. 10A shows the result. The channel 1004 is, for example, 500 $\mu$m long in the direction of a (110) crystal face orientation, and 0.4 $\mu$m wide in the direction of a (1-10) crystal face orientation.

As shown in FIG. 10B, a multiple quantum well stripe 1005 is formed at a certain position in the channel 1004 by the organometallic vapor deposition method. The multiple quantum well stripe 1005 is composed of a plurality of (e.g., five) pairs of a well layer and a barrier rib layer. The well layer may be made of InGaAsP having composition wavelength range of 1.4 $\mu$m. Also, the barrier rib layer may be made of InGaAsP having composition wavelength range of 1.05 $\mu$m. The well layer may be 0.006 $\mu$m thick, and the barrier rib layer may be 0.01 $\mu$m thick.

An SiO$_2$ layer 1006 is formed on the surface of the undope InGaAs etching stop layer 1002 to enclose a certain portion of the multiple quantum well stripe 1005 including one end thereof, as shown in FIG. 10C.

As shown in FIG. 10D, impurity ions (in this example, Zn) are injected through (1) a portion 1005A of the multiple quantum well stripe 1005 that is not covered with the SiO$_2$ layer 1006 and (2) a surface 1007 of a portion 1002A of the undope InGaAs etching stop layer 1002. The resultant structure is then subjected to a heat treatment so that the impurity-ion-introduced portions become p-type. The impurity-ion-introduced portions 1005 and 1002A are disordered in terms of the quantum well structure, and then function as light waveguides since the band gap energy exceeds the lasing energy.

The SiO$_2$ layer 1006 is then removed as shown in FIG. 10E.

An SiO$_2$ layer is again formed on the surface of the undope InGaAs etching stop layer 1002 to enclose only a part of the portion of the multiple quantum well stripe 1005 that was not covered with the SiO$_2$ layer 1006; impurity ions (in this example, Si) are injected through exposed portions; and the resultant structure is subjected to a heat treatment so that the impurity-ion-introduced portions become n-type, in the same manner as shown in FIGS. 10C to 10E. The Si-introduced portions of the active layer are disordered in terms of the quantum well structure, and then function as light waveguides since the band gap energy exceeds the lasing energy.

After the above process, the multiple quantum well stripe 1005 is composed of a p-type light waveguide 1008, a multiple quantum well area 1009, and an n-type light waveguide 1010 arranged in series in the extending direction of the stripes.

As shown in FIG. 10G, an undope InP layer 1011 is formed on the surface of the undope InGaAs etching stop layer 1002 to enclose the p-type light waveguide 1008, multiple quantum well area 1009, and n-type light waveguide 1010.

As show in FIG. 10H, an undope InP layer 1011, the p-type light waveguide 1008, multiple quantum well area 1009, and n-type light waveguide 1010 are shaped by the etching method into a plurality of stripes so that the p-type light waveguide 1008, multiple quantum well area 1009, and n-type light waveguide 1010 are included in one stripe. In this way, a plurality of stripes 1012 extending in the direction of a (110) crystal face orientation are manufactured. The stripes 1012 have the same period and width as the plurality of InP stripes which are used for the three-dimensional photonic crystal structure. Here, one stripe in which the p-type light waveguide 1008, multiple quantum well area 1009, and n-type light waveguide 1010 are included is used as the light confining unit.

In this way, the laser emitting layer is completed.

As shown in FIG. 10I, the structure that has been manufactured earlier and shown in FIG. 4F and the structure shown in FIG. 10H are put together so that the stripes of the two structures face each other and are perpendicular to each other (90° C.). The two structures are then heated while the stripes of the two structures are in contact so that the layers are bonded. Here, the stripes 1012 and stripes 1013 which are separated from the stripes 1012 by one layer are parallel to each other, but the phase of period is different from each other by 180°.

The semiconductor laser element in the present embodiment is completed after being subjected to the processes shown in FIGS. 6A to 7D.

The production method in the present embodiment provides both the effects provided by Embodiments 2 and 3. That is to say, the etching process for forming the active layer and the process for growing crystals for forming the light waveguide are eliminated.

Up to now, the present invention has been described in detail. However, the invention is not limited to the above embodiments. That is to say, the following variations are also possible.

In the above embodiments, the p-type light waveguide 305 and the n-type light waveguide 306 are made of InGaAsP. However, any material other than this may be used in so far as the band gap energy exceeds the band gap energy of the active layer (the well layer in case of the multiple quantum well type).

In the above embodiments, the composition wavelength range, or the oscillation wavelength range of the semiconductor laser element is 1.3 μm. However, it may be 1.55 μm or any of the following ones.

800 μm:: the substrate and stripes are made of GaAs, and the active layer is made of GaAs and AlGaAs and has the multiple quantum well structure.

650 μm:: the substrate is made of GaAs, striped are made of AlGaInP, and the active layer is made of AlGaInP and InGaP and has the multiple quantum well structure.

500 μm:: the substrate is made of GaAs, stripes are made of MgZnSSe, and the active layer is made of MgZnSSe and ZnSSe and has the multiple quantum well structure.

400 μm:: the substrate is made of sapphire, stripes are made of AlGaN or GaN, and the active layer is made of GaN and InGaN and has the multiple quantum well structure.

The above embodiments state that a substrate has a (001) crystal face orientation and that the stripes extend in the direction of a (110) crystal face orientation. These are preferred definitions for the directions. However, other directions are also possible.

In the above embodiments, each of the p-type light waveguide 305 and the n-type light waveguide 306 functions as a carrier conduction path and a light waveguide. However, carrier conduction paths and light waveguides may be provided separately.

In the above embodiments, one oscillation wavelength range is introduced. However, a plurality of oscillation wavelength ranges may be provided. This is achieved by, for example, dividing the InP stripes in the three-dimensional photonic crystal structure into a plurality of sections which each have a different period (pitch), forming in each section a light confining unit including an active layer that has a different composition wavelength range.

In the three-dimensional photonic crystal structure shown in the above embodiments, air layers and InP layers having different refractive indexes of light are arranged periodically. However, a plurality of stripes of materials having different refractive indexes of light may be arranged periodically.

Figure 11:
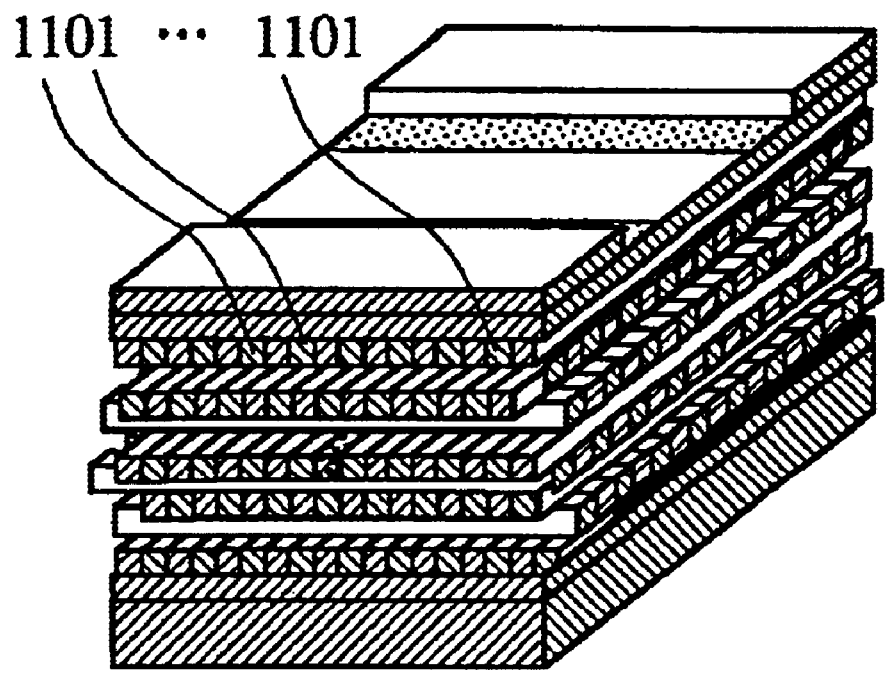
FIG. 11 is a perspective view of a variation of the semiconductor laser element in an embodiment of the present invention.

The air layers disposed between the InP stripes may be replaced with dielectric stripes 1101, for example, as shown in FIG. 11. Such a dielectric stripe may be made of $SiO_2$, SiN, $Al_2O_3$, or AlN. This construction prevents the element from being oxidized by air since air does not exist in the three-dimensional photonic crystal structure. This provides the element with superior reliability. It is preferred that AlN, among the above materials for the dielectric stripe, is used since it is superior in heat dissipation and provides the element with further reliability.

Figure 12A:
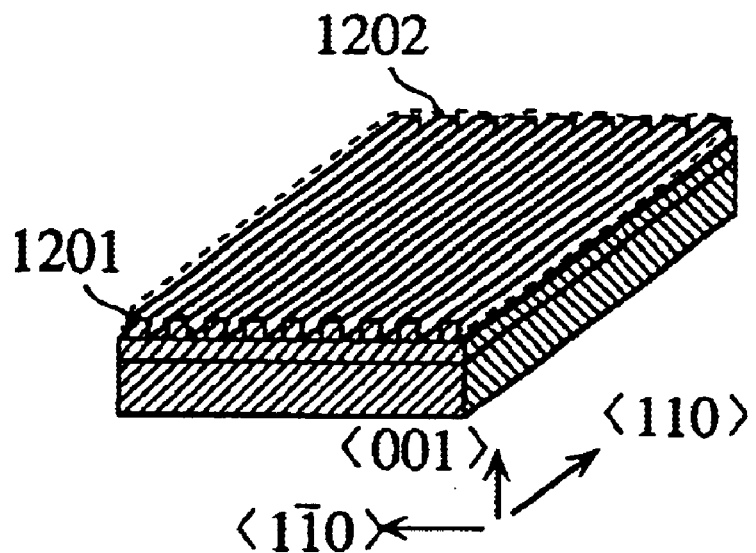
FIGS. 12A and 12B show a method of producing the semiconductor laser element shown in FIG. 11.
Figure 12B:
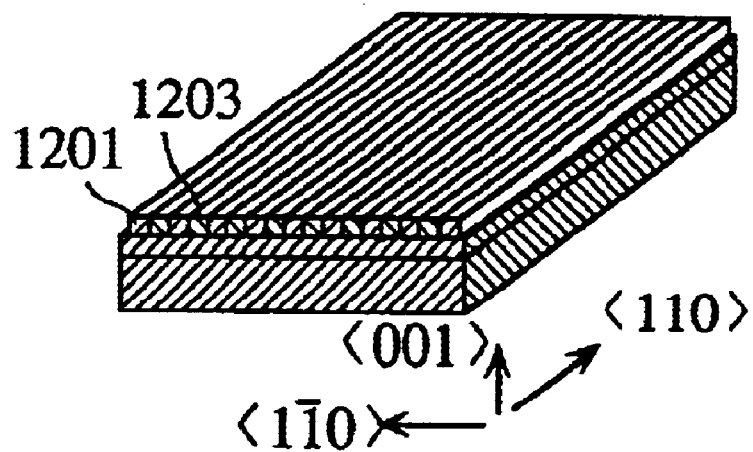

The above dielectric stripes may be formed by a method shown in FIGS. 12A and 12B. The InP stripes are formed first by the etching method shown in FIG. 4 (shaping the undope InGaAs layer into the InP stripes). The InP stripes are then covered with a dielectric stripe material layer 1202, as shown in FIG. 12A. The dielectric stripe material layer on the InP stripes is then removed by the etching method. This completes formation of dielectric stripes 1203 between the InP stripes, as shown in FIG. 12I.

Figure 13:
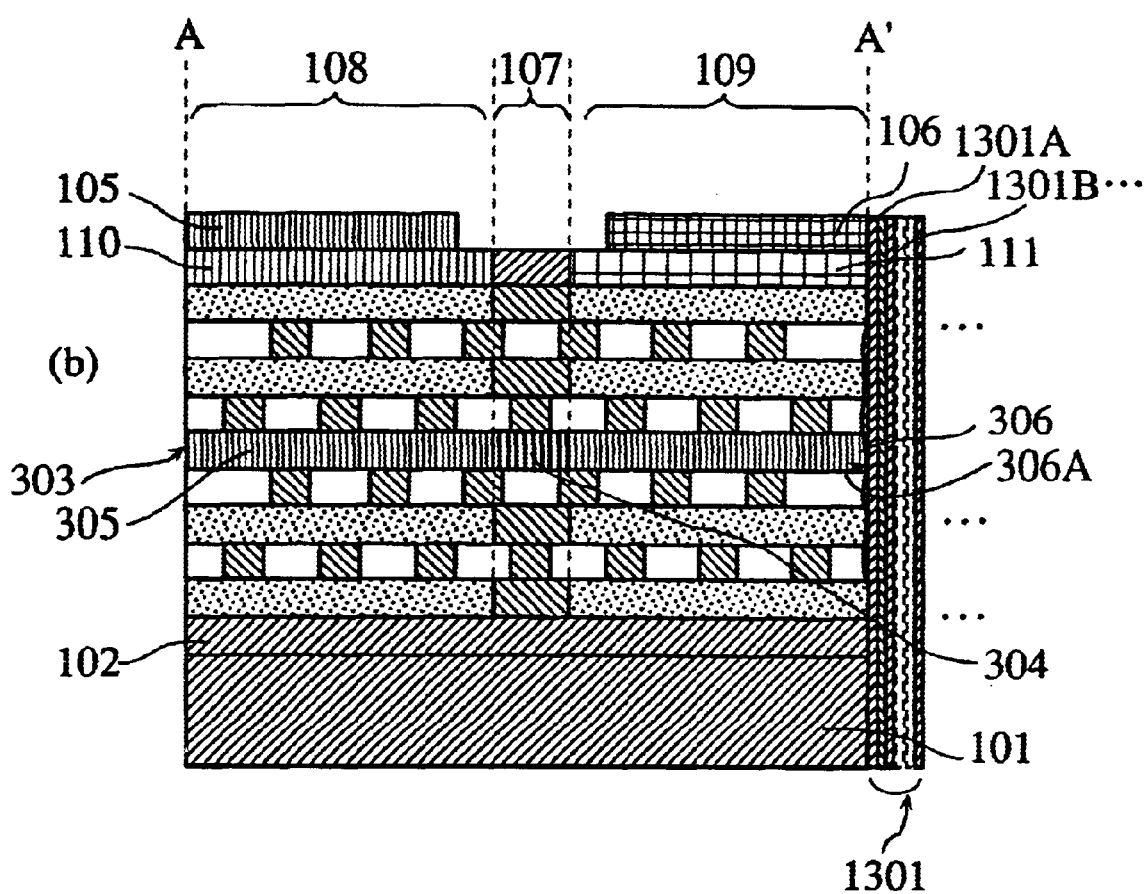
FIG. 13 is a sectional view showing the construction of a variation of the semiconductor laser element in an embodiment of the present invention.
Figure 14:
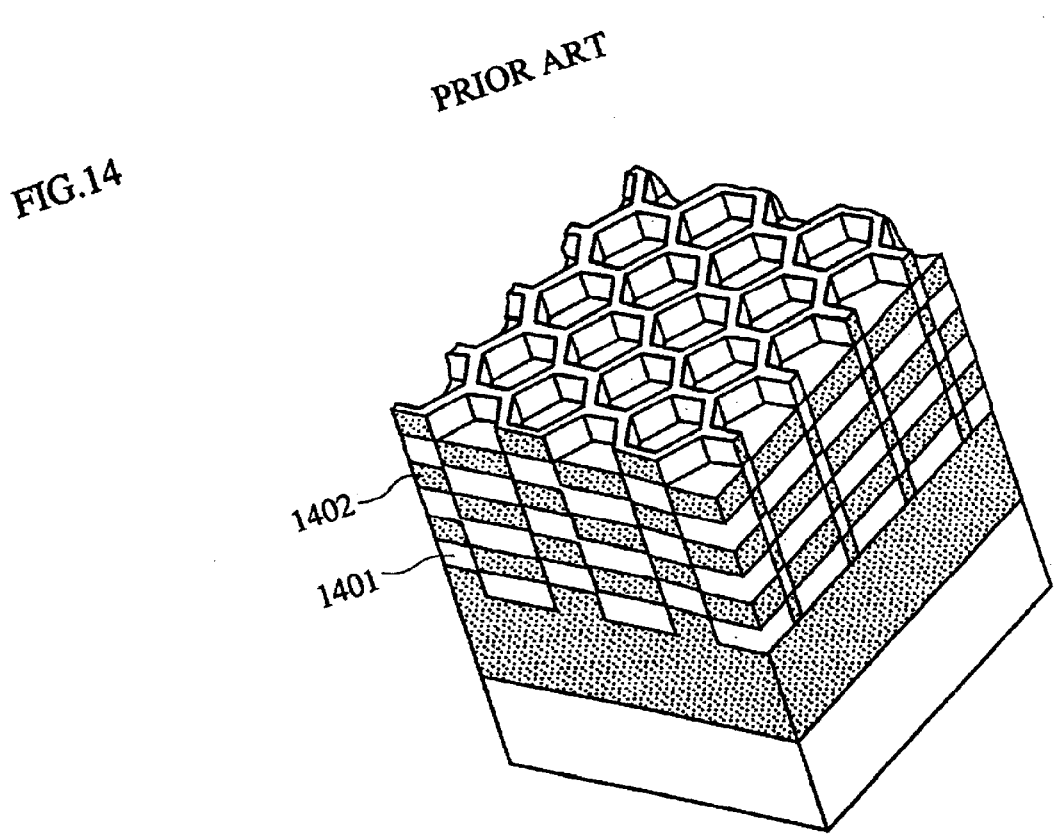
FIG. 14 is a perspective view showing the construction of a conventional three-dimensional photonic crystal structure.

In the above embodiments, laser beams generated in the active layer are propagated through the p-type light waveguide 305 and the n-type light waveguide 306 to the outside. However, a high-reflection layer 1301 may be formed at one end of one of the two waveguides as shown in FIG. 13 (in this example, at an end 306A of the n-type light waveguide 306) so that laser beams are emitted only from one waveguide. It is desirable that the high-reflection layer 1301 has 90% reflectivity or higher.

Typically, the high-reflection layer 1301 is composed of a plurality of dielectric layers. More specifically, the high-reflection layer 1301 is composed of a plurality of dielectric layers 1301A, 1301B, . . . each having thickness of λ/4n, where λ represents wavelength of a reflected light beam, and n a reflectivity. For example, the high-reflection layer 1301 includes at least a $SiO_2$ layer and an amorphous Si layer, in the order from the end of a waveguide.

It should be noted here that the diameter of the laser light pencil emitted from the semiconductor laser element with the above construction is very small since the laser light is emitted only from an end of the light confining unit 303 in the direction of length. It is therefore possible to use the semiconductor laser element as a near-field light source at a distance of several tens of nano-orders from a target of radiation (e.g., a compact disc).

As described above, the semiconductor laser element of the present invention has an excellent effect of confining the light generated in the active layer and a low-threshold-current characteristic since it uses the light confinement effect of the three-dimensional photonic crystal structure. Also, the three-dimensional photonic crystal structure of the present invention uses, instead of the conventional honeycomb-layer stack structure, first refractive index changing layers and second refractive index changing layers which are alternately stacked, where the refractive index of light periodically changes in a first direction in the first refractive index changing layers, and changes in a second direction in the second refractive index changing layers. This enables the active layer to be formed during the layer stacking process, achieving a semiconductor laser element using the three-dimensional photonic crystal structure.

Also, according to the method of the present invention for producing a semiconductor laser element, the active layer is formed during a process in which each layer constituting the three-dimensional photonic crystal structure is stacked, enabling a semiconductor laser element using the three-dimensional photonic crystal structure to be achieved. This allows the light confinement effect of the three-dimensional photonic crystal structure to be used. The present invention therefore provides a semiconductor laser element that is excellent in confining the light generated in the active layer and has a low-threshold-current characteristic.

The present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A semiconductor laser element comprising:
   a three-dimensional photonic crystal structure which has a light confining effect and includes alternating first and second refractive index changing layers, wherein refractive index of light periodically changes in a first direction in each first refractive index changing layer and periodically changes in a second direction in each second refractive index changing layer;
   a high-resistant substrate which has a substantially higher resistance than the three-dimensional photonic crystal structure which is disposed thereon;
   an active unit which is disposed in a portion having a predetermined refractive index inside the three-dimensional photonic crystal structure; and
   an electrode unit which is disposed in the three-dimensional photonic crystal structure, wherein an area between the electrode unit and the active unit in the three-dimensional photonic crystal structure functions as a conduction path over which electric current is supplied from the electrode unit to the active unit.

2. The semiconductor laser element of claim 1, wherein the active unit is disposed substantially at a center of the three-dimensional photonic crystal structure.

3. The semiconductor laser element of claim 2 further comprising
a light waveguide which extends horizontally from an end of the active unit to at least a vicinity of an end of the three-dimensional photonic crystal structure.

4. The semiconductor laser element of claim 2, wherein
each first refractive index changing layer is composed of a plurality of optically refractive stripes arranged parallel to each other with a predetermined pitch so that refractive index of light periodically changes in the first direction,
each second refractive index changing layer is composed of a plurality of optically refractive stripes arranged parallel to each other with substantially the same pitch as the predetermined pitch so that refractive index of light periodically changes in the second direction,
phase of period of the plurality of optically refractive stripes constituting one refractive index changing layer is different from a phase of period of the plurality of optically refractive stripes constituting adjacent refractive index changing layer, and
a laser emitting stripe that includes the active unit is disposed in place of one optically refractive stripe.

5. The semiconductor laser element of claim 4, wherein
the active unit is disposed substantially at a center of the laser emitting stripe in the direction of length, and two portions ranging from both ends of the active unit to both ends of the laser emitting stripe are a p-type light waveguide and an n-type light waveguide, respectively, the p-type and n-type light waveguides each doubling as a carrier conduction path.

6. The semiconductor laser element of claim 5, wherein
the area between the electrode unit and the active unit in the three-dimensional photonic crystal structure functioning as a conduction path is composed of a p-type carrier conduction path and an n-type carrier conduction path, the p-type carrier conduction path overlapping the p-type light waveguide, and the n-type carrier conduction path overlapping the n-type light waveguide,
the electrode unit is composed of a p-type electrode and an n-type electrode, the p-type electrode overlapping the p-type carrier conduction path, and the n-type electrode overlapping the n-type carrier conduction path, and
the semiconductor laser element further comprising:
a p-type contact layer which is disposed under the p-type electrode and overlaps the p-type carrier conduction path; and
an n-type contact layer which is disposed under the n-type electrode and overlaps the n-type carrier conduction path.

7. The semiconductor laser element of claim 6 further comprising
a high-reflection layer covering a side of the laser emitting stripe at an end in the direction of length.

8. The semiconductor laser element of claim 7, wherein the high-reflection layer is composed of a plurality of dielectric layers.

9. The semiconductor laser element of claim 8, wherein the high-reflection layer includes at least a $SiO_2$ layer and an amorphous Si layer, in the order from an end of the laser emitting stripe.

10. The semiconductor laser element of claim 4, wherein each optically refractive stripe is made of a material selected from the group consisting of InP, GaAs, AlGaInP, MgZnSSe, and AlGaN.

11. The semiconductor laser element of claim 2, wherein
each first refractive index changing layer is composed of (a) a plurality of optically refractive stripes arranged parallel to each other with a predetermined pitch and (b) a plurality of dielectric stripes displacing space between the plurality of optically refractive stripes so that refractive index of light periodically changes in the first direction,
each second refractive index changing layer is composed of (c) a plurality of optically refractive stripes arranged parallel to each other with substantially the same pitch as the predetermined pitch and (d) a plurality of dielectric stripes displacing space between the plurality of optically refractive stripes in (c) so that refractive index of light periodically changes in the second direction,
phase or period of the plurality of optically refractive stripes constituting one refractive index changing layer is different from phase of period of the plurality of optically refractive stripes constituting adjacent refractive index changing layer, and
one optically refractive stripe has been replaced with a laser emitting stripe that includes the active unit.

12. The semiconductor laser element of claim 11, wherein
the active unit is disposed substantially at a center of the laser emitting stripe in the direction of length, and two portions ranging from both ends of the active unit to both ends of the laser emitting stripe are a p-type light waveguide and an n-type light waveguide, respectively, the p-type and n-type light waveguides each doubling as a carrier conduction path.

13. The semiconductor laser element of claim 12, wherein
the area between the electrode unit and the active unit in the three-dimensional photonic crystal structure functioning as a conduction path is composed of a p-type carrier conduction path and an n-type carrier conduction path, the p-type carrier conduction path overlapping the p-type light waveguide, and the n-type carrier conduction path overlapping the n-type light waveguide,
the electrode unit is composed of a p-type electrode and an n-type electrode, the p-type electrode overlapping the p-type carrier conduction path, and the n-type type electrode overlapping the n-type carrier conduction path, and
the semiconductor laser element further comprising;
a p-type contact layer which is disposed under the p-type electrode and overlaps the p-type carrier conduction path; and
an n-type contact layer which is disposed under the n-type electrode and overlaps the n-type carrier conduction path.

14. The semiconductor laser element of claim 13 further comprising
a high-reflection layer covering a side of the laser emitting stripe at an end in the direction of length.

15. The semiconductor laser element of claim 13, wherein the high-reflection layer is composed of a plurality of dielectric layers.

16. The semiconductor laser element of claim 15, wherein the high-reflection layer includes at least a SiO$_2$ layer and an amorphous Si layer, in the order from an end of the laser emitting stripe.

17. The semiconductor laser element of claim 11, wherein each optically refractive stripe is made of a material selected from the group consisting of InP, GaAs, AlGaInP, MgZnSSe, and AlGaN, and each dielectric stripe is made of a material selected from the group consisting of SiO$_2$, SiN, Al$_2$O$_3$, and AlN.

18. The semiconductor laser element of claim 1, wherein the semiconductor laser element is substantially insulated except for the active layer and the area in the three-dimensional photonic crystal structure functioning as a conduction path.

19. A semiconductor laser element comprising:

a three-dimensional photonic crystal structure which has a light confining effect and includes alternating first and second refractive index changing layers, wherein refractive index of light periodically changes in a first direction in each first refractive index changing layer and periodically changes in a second direction in each second refractive index changing layer, the first index changing layer comprises a plurality of spaced optically refractive elongated stripes arranged parallel to each other with a first predetermined pitch so that a refractive index of light periodically changes in the first direction and the second index changing layer comprises a plurality of spaced optically refracting elongated stripes arranged parallel to each other with a second predetermined pitch different than the first pitch so that a refractive index of light periodically changes in a second direction; and an active unit which is disposed in a portion having a predetermined refractive index inside the three-dimensional photonic crystal structure, and generates a laser beam in response to reception of electric power, the active unit has a stack of first index changing and second index changing layers above and below the active unit.

20. The semiconductor laser element of claim 19, wherein the active unit is disposed substantially at a center of the three-dimensional photonic crystal structure.

21. The semiconductor laser element of claim 20 further comprising a light waveguide which extends horizontally from an end of the active unit to at least a vicinity of an end of the three-dimensional photonic crystal structure.

22. The semiconductor laser element of claim 20 wherein axes of the first parallel elongated stripes are perpendicular to axes of the second parallel stripes.

23. The semiconductor laser element of claim 19 wherein a p-type electrode and an n-type electrode are positioned on the same side surface of the photonic crystal structure.

24. The semiconductor laser element of claim 19 wherein a plurality of elongated spaced dielectric layers separate the respective first parallel elongated stripes and a plurality of elongated spaced dielectric layers separate the respective second parallel elongated stripes.

25. The semiconductor laser element of claim 24 wherein a laser emitting stripe that includes the active unit is disposed in place of one optically refractive stripe.

26. The semiconductor laser element of claim 25 wherein the active unit is disposed substantially at a center of the laser emitting stripe in the direction of length, and two portions ranging from both ends of the active unit to both ends of the laser emitting stripe are a p-type light waveguide and an n-type light waveguide, respectively, the p-type and n-type light waveguides each doubling as a carrier conduction path.

27. A semiconductor laser element comprising:

a three-dimensional photonic crystal structure which has a light confining effect and includes alternating first and second refractive index changing layers, wherein refractive index of light periodically changes in a first direction in each first refractive index changing layer and periodically changes in a second direction in each second refractive index changing layer, the first index changing layer comprises a plurality of spaced optically refractive straight elongated stripes arranged parallel to each other with a first predetermined pitch so that a refractive index of light periodically changes in the first direction and the second index changing layer comprises a plurality of spaced optically refracting straight elongated stripes arranged parallel to each other with a second predetermined pitch different than the first pitch so that a refractive index of light periodically changes in a second direction; and an active unit which is disposed in a portion having a predetermined refractive index inside the three-dimensional photonic crystal structure, and generates a laser beam in response to reception of electric power, the active unit has a stack of first index changing and second index changing layers above and below the active unit with the first index changing layer straight elongated stripes crossing the second index changing layer straight elongated stripes.

28. The semiconductor laser element of claim 27 further including a p-type light wave guide and an n-type light waveguide positioned on either side of the active unit to form a laser emitting stripe that is disposed in place of one optically refractive straight elongated stripe in one of the first index changing layer and the second index changing layer.

* * * * *